US010419766B2

(12) United States Patent
LaBosco et al.

(10) Patent No.: US 10,419,766 B2
(45) Date of Patent: Sep. 17, 2019

(54) NETWORK VIDEO CLOCK DECOUPLING

(71) Applicant: Crestron Electronics, Inc., Rockleigh, NJ (US)

(72) Inventors: Mark LaBosco, New City, NY (US); Agesino Primatic, Pittstown, NJ (US); Michael Bottiglieri, River Vale, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 15/940,151

(22) Filed: Mar. 29, 2018

(65) Prior Publication Data

US 2018/0288424 A1 Oct. 4, 2018

Related U.S. Application Data

(60) Provisional application No. 62/479,898, filed on Mar. 31, 2017.

(51) Int. Cl.
| | |
|---|---|
| *H04N 19/172* | (2014.01) |
| *H04N 19/86* | (2014.01) |
| *H03L 7/06* | (2006.01) |
| *H04N 19/146* | (2014.01) |
| *H04N 21/24* | (2011.01) |
| *H04L 29/06* | (2006.01) |
| *H04N 21/242* | (2011.01) |
| *H04N 21/43* | (2011.01) |

(52) U.S. Cl.
CPC ............. *H04N 19/172* (2014.11); *H03L 7/06* (2013.01); *H04L 65/4076* (2013.01); *H04L 65/4084* (2013.01); *H04L 65/607* (2013.01); *H04L 65/608* (2013.01); *H04L 65/80* (2013.01); *H04N 19/146* (2014.11); *H04N 19/86* (2014.11); *H04N 21/24* (2013.01); *H04N 21/242* (2013.01); *H04N 21/4305* (2013.01)

(58) Field of Classification Search
CPC ... H04N 19/172; H04L 65/608; H04L 65/607; H04L 65/4084; H04L 65/4076
See application file for complete search history.

(56) References Cited

U.S. PATENT DOCUMENTS

| | | | |
|---|---|---|---|
| 6,316,974 B1 | 11/2001 | Taraci et al. | |
| 6,441,658 B1 | 8/2002 | Taraci et al. | |

(Continued)

*Primary Examiner* — Nam D Pham
(74) *Attorney, Agent, or Firm* — Crestron Electronics, Inc.

(57) ABSTRACT

Presented are a system and method for distributing video over a network. The system includes a source that outputs video with a first frame rate, a transmitter, a receiver, and a sink. The transmitter receives video from the source and processes the video by encoding the video with frame boundary information, packetizing, and transmitting the video. The receiver includes a frame buffer, a timing generator, and a PLL. The receiver receives and processes the video by retrieving the frame boundary information, decoding the video into sub-frames, and writing the sub-frames to the buffer. All the processing occurs on sub-frame portions of the video in sub-frame time intervals. The receiver transmits video with a second frame rate to the sink. The timing generator generates output timing and uses the PLL to synchronize the output timing with the frame boundary information and synchronizes the first and second frame rates.

22 Claims, 17 Drawing Sheets

(56) References Cited

U.S. PATENT DOCUMENTS

| | | | |
|---|---|---|---|
| 8,462,268 B2 * | 6/2013 | Ryan | H04N 5/06 |
| | | | 327/147 |
| 9,807,408 B2 | 10/2017 | Maurice | |
| 2016/0066000 A1 | 3/2016 | Cunningham et al. | |

* cited by examiner

NETWORK VIDEO CLOCK DECOUPLING

BACKGROUND OF THE INVENTION

Technical Field

The present disclosure relates generally to streaming audio/video data, and more particularly to streaming audio/video data over an IP network.

Background

Real time digital video signals are typically transported over cables synchronized to a pixel clock. The high definition multimedia interface (HDMI) has a clock channel that includes a signal either equal to the pixel clock or a ratio of the pixel clock. When packetizing video to transport over an IP network, the ability to transmit a free running clock is lost. Networks introduce packet jitter, and packets may get lost and require error correction. In addition, video compression schemes, often used to reduce the network bandwidth required to transmit video, result in a variable amount of data transmitted for a given frame and the loss of all sync timing.

Numerous schemes created to recreate a clock at the network video receiver attempt to recreate a signal synchronized to the original video pixel clock or to a network master clock.

A video scaler is often used to change the resolution (i.e., pixel matrix size) of the active video image to match the native resolution of a display (i.e., a different pixel matrix size). Scalers are often associated with frame buffers which can be used to implement frame rate conversion. The source clock (for the input resolution) and the output clock (for the scaled resolution) can be the same or different. In the case where the native resolution of a display matches the resolution of the active video image, the pixel matrix sizes are the same.

At the output of a video frame buffer, a video timing generator produces the proper timing signals for a display and is used to determine the memory locations to read to refresh the display. It is well known in the art that if the input and output of the frame buffer are asynchronous, there would be tearing artifacts or skip/repeat stutter artifacts. Asynchronous video transmission methods introduce variable delays due to the use of multiple frame buffers. To prevent this, it would be desirable to synchronize the frame rate of data read from the frame buffer with the frame rate of data written to the buffer, but the original source sync information is lost due to packetizing and jitter of the network video.

Ethernet networks utilize packets to communicate data. Address information allows delivery of messages to one or multiple destinations. The arrival time of a message is not deterministic, although mechanisms such as Quality of Service (QoS) & Class of Service (CoS) can help to reduce the variability of the arrival time. Various time-based protocols such as IEEE 1588 have been used to synchronize the time bases of multiple network devices. Some of these network time mechanisms require special hardware to insert or manipulate the timestamps of packets.

SUMMARY OF THE INVENTION

It is to be understood that both the general and detailed descriptions that follow are exemplary and explanatory only and are not restrictive of the invention.

DISCLOSURE OF THE INVENTION

In one aspect, the disclosure involves a system for distributing video data over a network. The system includes at least one asynchronous video source configured for outputting video data over a first interface, where the video data has a first frame rate. The system further includes at least one video sink and at least one video transmitter. The video transmitter is configured for receiving video data from the at least one video source over the first interface. The video transmitter is also configured for processing the video data by encoding the video data to include video frame boundary information, packetizing the video data, and transmitting the video data over the network. All the processing occurs on sub-frame portions of the video data in sub-frame time intervals. The system further includes at least one video receiver comprising a video frame buffer, a video timing generator, and a phase-locked loop, the at least one video receiver being configured for receiving the video data over the network and processing the video data by retrieving the video frame boundary information, by decoding the video data into video sub-frames, and by writing the video sub-frames to the video frame buffer, where the processing occurs on sub-frame portions of the video data in sub-frame time intervals, the at least one video receiver being further configured for transmitting output video having a second frame rate to the video sink over a second interface, the video timing generator being configured for generating video output timing signals and using the phase-locked loop to synchronize the generated video output timing signals with the video frame boundary information and thereby synchronizing the first frame rate with the second frame rate.

In one embodiment, the at least one video receiver processes the video data by converting the video data from a first pixel matrix size with an associated first pixel clock to a second pixel matrix size with an associated second pixel clock.

In another embodiment, the at least one video transmitter is configured for processing the video data by encoding forward error correction data into the video data, and the at least one video receiver is configured for processing the video data by retrieving the forward error correction data and recovering corrupt or lost video data.

In still another embodiment, the at least one video transmitter is configured for processing the video data by compressing the video data, and the at least one video receiver is configured for processing the video data by decompressing the compressed video data.

In yet another embodiment, the at least one video receiver includes a sub-frame playout delay, and the at least one video receiver is configured for processing the video data by using the sub-frame playout delay to convert a variable decompression delay into a constant fixed delay and thereby reduce the variability of the data rate of the decompressed video data.

In another embodiment, the phase-locked loop uses read and write positions of the frame buffer to calculate phase error, and the read or write positions of the frame buffer are offset to provide a buffer delay prior to calculating the phase error. The buffer delay is adjusted to compensate for measured network jitter between the at least one video transmitter and the at least one video receiver.

In still another embodiment, the at least one video receiver is further configured for switching from processing video data received from the at least one transmitter to processing video data received from a second transmitter, and the video timing generator generates free running timing signals after the switching and gradually synchronizes with the second transmitter thereby preventing the sink from losing signal lock.

In yet another embodiment, the at least one video transmitter is further configured for switching from processing video data received from the at least one source to processing video data received from a second source, and the video timing generator generates free running timing signals after the switching and gradually synchronizes with the second source thereby preventing the sink from losing signal lock.

In another embodiment, the system further includes a plurality of video receivers and a plurality of video displays. Each of the plurality of video receivers transmits a different upsampled portion of the output video to a different one of the plurality of video displays, thereby producing a complete video image across the plurality of video displays.

In another aspect, the disclosure involves a method for distributing video data over a network. The method includes providing at least one asynchronous video source, outputting, by the at least one video source, video data over a first interface, where the video data has a first frame rate. The method further includes providing at least one video sink, providing at least one video transmitter, and receiving, by the at least on video transmitter, video data from the at least one video source over the first interface. The method further includes processing, by the at least one video transmitter, the video data by encoding the video data to include video frame boundary information packetizing the video data, where the processing occurs on sub-frame portions of the video data in sub-frame time intervals. The method further includes transmitting, by the at least one video transmitter, the video data over the network, and providing at least one video receiver that includes a video frame buffer, a video timing generator, and a phase-locked loop. The method further includes receiving, by the at least one video receiver, the video data over the network. The method further includes processing, by the at least one video receiver, the video by retrieving the video frame boundary information, decoding the video data into video sub-frames, and writing the video sub-frames to the video frame buffer, where the processing occurs on sub-frame portions of the video data in sub-frame time intervals. The method further includes transmitting, by the at least one video receiver, output video having a second frame rate to the video sink over a second interface, and generating, by the video timing generator, video output timing signals. The method further includes synchronizing, by the video timing generator, the generated video output timing signals with the video frame boundary information by using the phase-locked loop and thereby synchronizing the first frame rate with the second frame rate.

In one embodiment, the method further includes processing, by the at least one video receiver, the video data by converting the video data from a first pixel matrix size having a first pixel clock to a second pixel matrix size having a second pixel clock.

In another embodiment, the method further includes processing, by the at least one video transmitter, the video data by encoding forward error correction data into the video data. The method still further includes processing, by the at least one video receiver, the video data by retrieving the forward error correction data and recovering corrupt or lost video data.

In still another embodiment, the method further includes processing, by the at least one video transmitter, the video data by compressing the video data. The method still further includes processing, by the at least one video receiver, the video data by decompressing the compressed video data.

In yet another embodiment, the at least one video receiver further includes a sub-frame playout delay. The method further includes processing, by the at least one video receiver, the video data by using the sub-frame playout delay to convert a variable decompression delay into a constant fixed delay and thereby reduce the variability of the data rate of the decompressed video data.

In another embodiment, the method further includes calculating phase error, by the phase-locked loop, using read and write positions of the frame buffer. The method further includes offsetting the read or write positions of the frame buffer to provide a buffer delay prior to calculating the phase error. The method further includes adjusting the buffer delay to compensate for measured network jitter between the at least one video transmitter and the at least one video receiver.

In still another embodiment, the method further includes switching, by the at least one video receiver, from processing video data received from the at least one transmitter to processing video data received from a second transmitter. The method further includes generating, by the video timing generator, free running timing signals after the switching and gradually synchronizing with the second transmitter thereby preventing the sink from losing signal lock.

In yet another embodiment, the method further includes switching, by the at least one video receiver, from processing video data received from the at least one source to processing video data received from a second source. The method further includes generating, by the video timing generator, free running timing signals after the switching and gradually synchronizing with the second source thereby preventing the sink from losing signal lock.

In another embodiment, the method further includes providing a plurality of video receivers and a plurality of video displays, and transmitting, by each of the plurality of video receivers, a different upsampled portion of the output video to a different one of the plurality of video displays and thereby producing a complete video image across the plurality of video displays

BRIEF DESCRIPTION OF DRAWINGS

The accompanying figures further illustrate the present invention. Exemplary embodiments are illustrated in reference figures of the drawings. It is intended that the embodiments and figures disclosed herein are to be considered to illustrative rather than limiting.

The components in the drawings are not necessarily drawn to scale, emphasis instead being placed upon clearly illustrating the principles of the present invention. In the drawings, like reference numerals designate corresponding parts throughout the several views.

LIST OF REFERENCE NUMBERS FOR THE MAJOR ELEMENTS IN THE DRAWINGS

Figure 1:
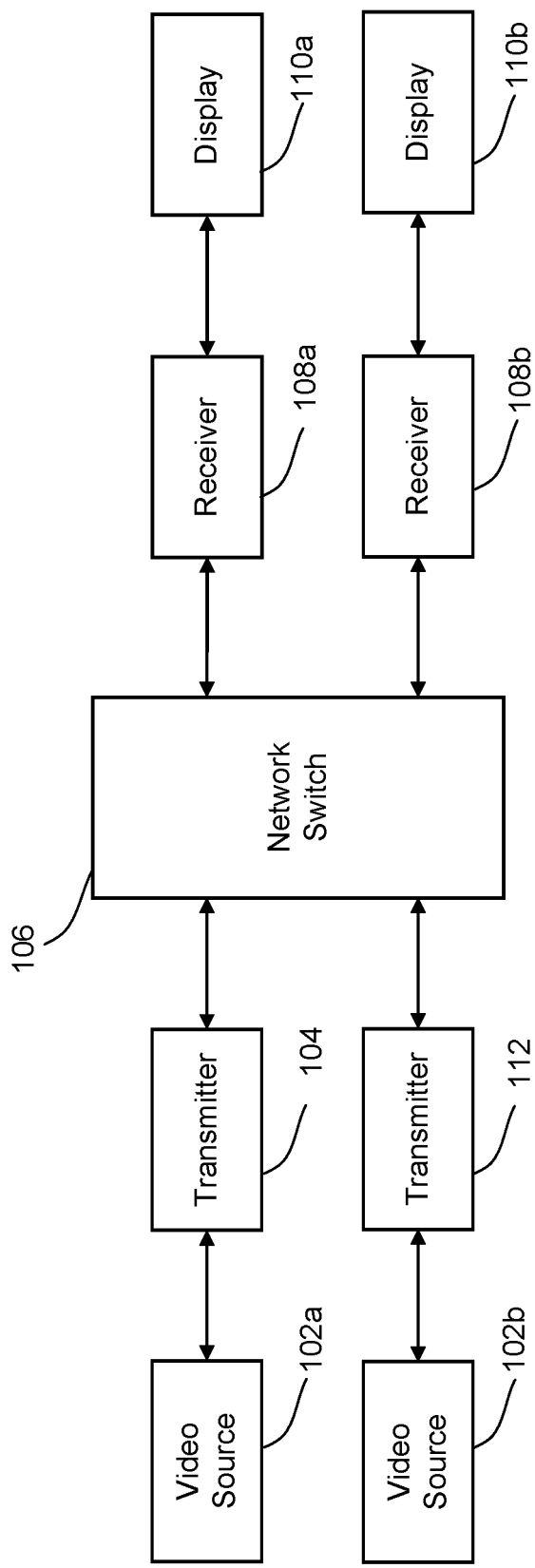
FIG. 1 is an illustrative block diagram of a video distribution system, according to one embodiment of the invention.

The following is a list of the major elements in the drawings in numerical order.

100 video distribution system
102a-b video source
104 uncompressed video transmitter
106 network switch
108a-b receiver
110a-b display
112 compressed video transmitter
202 video input
204 uncompressed video packetization module
206 measured frequency module
208 DM infoPacket creation module
210 frame number module
212 multiplexer
214 RTP header insertion module
216 SMPTE 2022 encapsulation module
218 network output
220 Tx system timer module
222 DM header insertion module
302 video input
304 video compression module
306 measured frequency module
308 DM infoPacket module
310 frame number module
312 multiplexer
314 RTP header insertion module
316 SMPTE 2022 encapsulation module
318 network output
320 Tx system timer module
322 MPEG-TS encapsulation module
400 receiver
402 receiver network input
404 SMPTE 2022 decapsulation module
406 uncompressed video extraction module
408 MPEG-TS decapsulation module
410 video decompression module
412 frame playout delay module
414 Rx system timer
416 multiplexer
418 video frame buffer
420 video timing generator
422 video output
424 Rx start-of-frame & frame number extraction module
426 video clock
428 video clock locking module
430 clock control module
432 Tx start-of-frame & frame number extraction module
434 scaler
500 phase-lock loop module
502 summer module
504 low-pass filter
506 proportional-derivative filter
508 discriminator
510 clock generator
512 fractional counter
514 adjusted phase_diff
516 freq. inc/dec
518 video clock
520 count_per_clock
522 Rx_top_of_frame
524 Rx_frac_frame
526 Tx_frame_num
528 Rx_frame_num
530 Tx_frac_frame
532 offset
534 Tx_top_of_frame
536 clamp module
602 frame writer module
604 frame reader module
606 address control module
702 At Tx top-of-frame, capture Rx position in frame
704 Calculate adjusted phase difference between Tx and Rx frames
706 Clamp phase difference to +/−1 frame
708 filter the phase difference with the low-pass filter
710 filter the filtered phase difference with the Proportional-Derivative filter
712 If the magnitude of the resultant value is above a threshold, adjust clock frequency proportional to this value
800 timing diagram
900 fractional divider
904 multiplexer
906 reference finite state machine (FSM)
908 reference time temp
910 reference time
912 local phase monitor
914 local time
1002 Video pixels are received by the transmitter along with synchronization timing signals from the video source
1004 The video pixel frequency is measured
1006 A frame number is assigned to the current video frame
1008 Video frames are segmented into video packets
1010 For each frame, the frame number and measured frequency are inserted into a once-per-frame DM InfoPacket
1012 Prepend a DM header to each packet
1014 Wrap packets with RTP
1016 Wrap packets with SMPTE-2022 data
1018 Transmit packets to the receiver
1020 Use the SMPTE-2022 data to correct any errors
1022 Reassemble video packets into video pixels
1024 Send video pixels to scaler
1026 Extract the start-of-frame signal (Tx_top_of_frame) and frame number (Tx_frame_num) from video stream
1028 Write video pixels to the frame buffer
1030 Read video pixels out of the frame buffer
1032 Extract the start-of-frame signal (Rx_top_of_frame) and frame number (Rx_frame_num) from video stream
1034 Calculate the phase difference (delay) between the Tx Frame being written into the frame buffer and the Rx Frame being read out of the frame buffer
1036 Adjust phase difference with offset
1038 Clamp and filter adjusted phase difference 1040 The filtered adjusted phase difference is thresholded
1042 Produce adjusted clock
1044 Convert adjusted clock into control signals
1046 Use the control signals to produce the pixel clock
1048 Output video pixels along with sync timing to the display
1102 Video pixels are received by the transmitter along with synchronization timing signals from the video source
1104 The video pixel frequency is measured
1106 A frame number is assigned to the current video frame
1108 Video frames are compressed and segmented into compressed video
1110 PES and TS headers are applied to the compressed video with timing information
1112 For each frame, the frame number and measured frequency are inserted into a once-per-frame DM InfoPacket
1114 Prepend an RTP header to each packet
1116 Wrap packets with SMPTE-2022 data
1118 Transmit packets to the receiver
1120 Use the SMPTE-2022 data to correct any errors
1122 Transmit Elementary Stream compressed video to the video decompression module
1124 Uncompress the compressed video packets into video pixels
1126 Delay uncompressed video pixel frame until the maximum delay through the system has elapsed, and then output video frame.
1128 Send video pixels to scaler
1130 Extract the start-of-frame signal (Tx_top_of_frame) and frame number (Tx_frame_num) from video stream
1132 Write video pixels to the frame buffer
1134 Read video pixels out of the frame buffer
1136 Extract the start-of-frame signal (Rx_top_of_frame) and frame number (Rx_frame_num) from video stream
1138 Calculate the phase difference (delay) between the Tx Frame being written into the frame buffer and the Rx Frame being read out of the frame buffer
1140 Adjust phase difference with offset
1142 Clamp and filter adjusted phase difference
1144 The filtered adjusted phase difference is thresholded
1146 Produce adjusted clock
1148 Convert adjusted clock into control signals
1150 Use the control signals to produce the pixel clock
1152 Output video pixels along with sync timing to the display

DETAILED DESCRIPTION OF THE INVENTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

MODE(S) FOR CARRYING OUT THE INVENTION

The invention involves a method for encoding video frame boundary information (e.g., frame number, top-of-frame/start-of-frame, and transmitter system timestamps) into transmitted data packets that can be later used to reconstruct enough timing information to synchronize the output of a video receiver timing generator to an original input video signal while tolerating variable network latency, out of order packets, or lost packets. In addition, by using sequence information in the packet data, the amount of buffering can be reduced, which results in lower end-to-end latency.

Switching is accomplished by a receiver subscribing to a different multicast stream. When switching one displayed source signal to another source signal that are not synchronized to each other, the video display attached to the receiver's output could generate a frame that is too short or too long. The sudden change in video timing will cause the video display to unlock (lose synchronization) and display an error message or blue screen. To avoid this behavior, it is desirable to keep the display timing constant during video changes. To do this, the disclosed video timing generator generates free running timing signals after the input source is changed or when the input resolution is changed. Over time, the video output (video from the receiver to the display) converges to be synchronous (i.e., gradually synchronizes) to the input video frame (source video) because the receiver continually monitors the video output to adjust the output pixel clock so that the output frame rate matches the source frame rate.

Additionally, the latency introduced by a frame buffer can be configured to compensate for network jitter. A well-controlled network with low jitter can have the read pointer lag the write pointer by a small amount. A network with large amounts of jitter might cause image artifacts if the pointers cross. To prevent this, the delay between the write and read pointer can be either manually set, or automatically set by monitoring the amount of jitter on the incoming stream. Jitter can be measured in various ways including time stamping the packets and comparing the time stamps to arrival times, monitoring data buffer high/low fill level, monitoring frame buffer write time intervals, etc.

Most video receivers use a free-running output video clock and take advantage of a frame buffer to skip and repeat frames to synchronize output video frames to incoming video. This can produce a multi-frame delay from the receiver's input to its output, as well as a delay variability of up to +/−1 frame. To provide the lowest latency possible for A/V receivers, a different approach is required. There are three parts to generating low latency through the video receiver that include a method of extracting timing information from the input to the video receiver, a method of synchronizing the output of the video receiver to this timing information, and a frame buffer that provides sub-frame latency.

Referring to FIG. 1, a video distribution system 100 is shown. In one embodiment, the video distribution system 100 includes a video sources 102a-102b (generally 102, e.g., Blu-ray disc® player), a transmitter 104 for transmitting uncompressed video, a transmitter 112 for transmitting compressed video, a network switcher 106, receivers 108a-b (generally 108), and displays 110a-110b (generally 110), In other embodiments, the system 100 includes more or less video sources, transmitter, receivers, and displays.

The input video to the video receiver 108 can include either uncompressed or compressed video. If the input video data is uncompressed, the input video data includes packets of information that include the required components to reconstruct the video (e.g., frame number and top-of-frame). If the input video data is compressed, then some indication of frame number and start-of-frame needs to be inserted into the compressed stream by a video transmitter 112 so it can be extracted at the input of the video receiver 108. Note that this timing information, in one embodiment, includes various amounts of variable delay due to packetization, network jitter, error correction, and, for compressed video, decompression time variation, which can be proportional to picture complexity.

Figure 2:
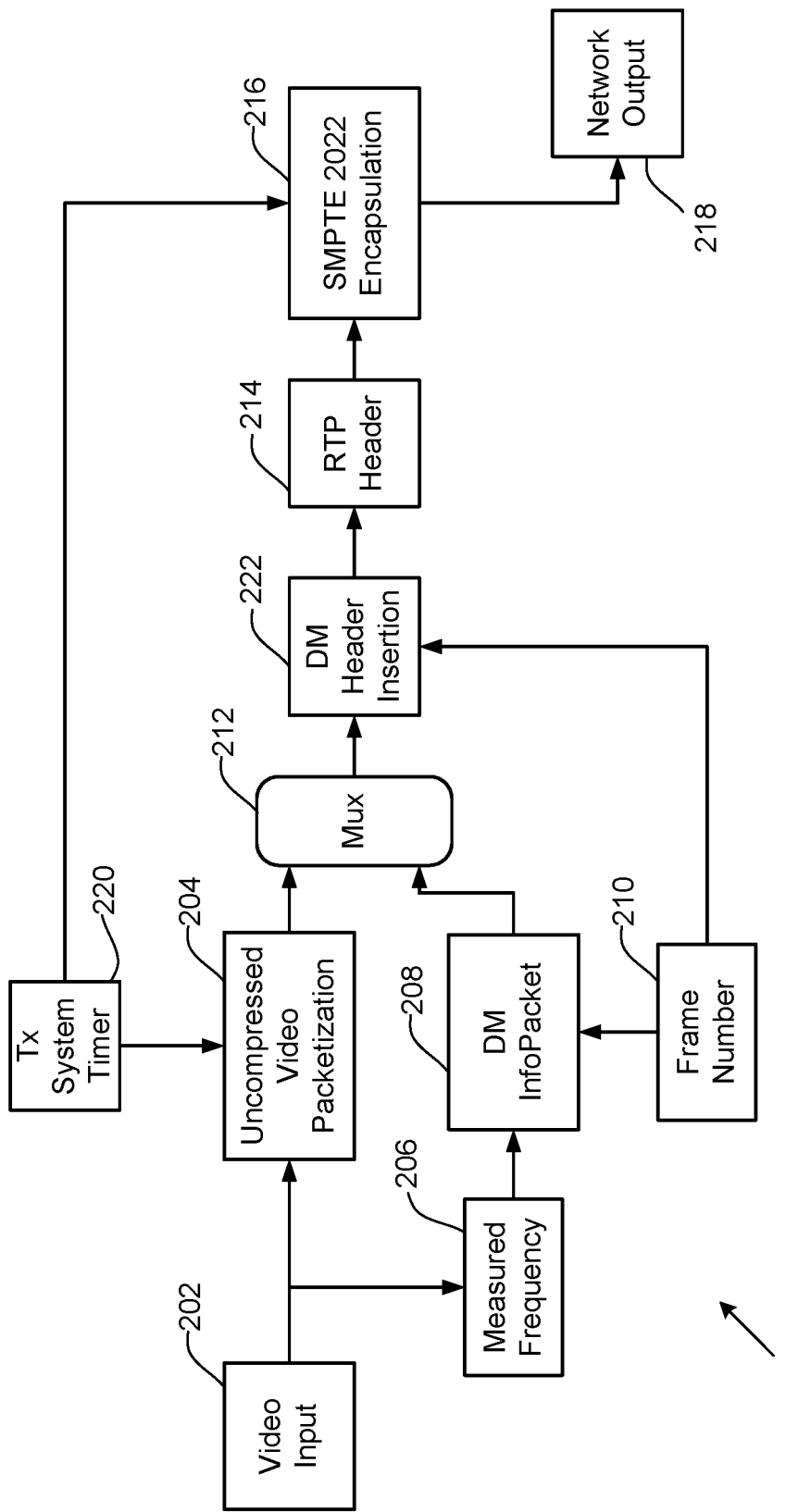
FIG. 2 is an illustrative block diagram of a video transmitter configured for transmitting uncompressed video, according to one embodiment of the invention.

Referring to FIG. 2, a block diagram of the transmitter 104 for transmitting uncompressed video is shown. The transmitter 104 includes video input 202, uncompressed video packetization module 204, measured frequency module 206, DM infoPacket creation module 208, frame number module 210, multiplexer module 212, DM header insertion module 222, Realtime Transfer Protocol (RTP) header insertion module 214, SMPTE 2022 encapsulation module 216, a Tx system timer module 220, and network output module 218. In various embodiments, the above-listed modules are implemented using discrete integrated circuits, or in firmware programmed onto field programmable gate arrays (FPGAs), or a combination of both.

The video input 202 receives (from a video source 102) raw video along with synchronization pulses Hsync and Vsync. The uncompressed Video Packetization module 204 converts the raw video into packets suitable for transmitting over UDP/IP using unicast, multicast, or broadcast addressing. The Tx system timer module 220 is a free running counter that serves as the transmitter 112 "time-base" (clock). The Tx system timer 220 is sampled to obtain timestamps marking the arrival of A/V content such as a video frame or audio samples, to be carried as metadata to one or more receivers 108 and aid in establishing play back timing. The measured frequency module 206 counts incoming pixel clocks using a fixed clock on the transmitter 104. This provides a measure of the incoming video pixel clock frequency.

The frame number module 210 increments at the start of every frame (initial value is unimportant). DM InfoPacket creation module 208 creates a packet containing various parameters including, but not limited to, the measured pixel clock frequency (from the measured frequency module 206), the frame number (from the frame number module 210), and AES encryption information, video format information, and pixel clock information. The multiplexer 212 switches between forwarding video packets or DM InfoPackets to the DM header insertion module 222. The DM header insertion module 222 adds a header to the beginning of every packet that contains the top of frame bit, frame number, and position of the video in the frame. The RTP header insertion module 214 only adds a header to the video packets that is required by the SMPTE 2022 encapsulation module 216. The RTP header is not otherwise used in the uncompressed video transmitter 104. The SMPTE 2022 encapsulation module 216 adds Forward Error Correction (FEC) packets to the incoming stream so that a receiver can correct errors. The network output 218 outputs the IP packets from the transmitter 104. The IP packets are sent over a video distribution network and eventually received by a receiver 108.

Figure 3:
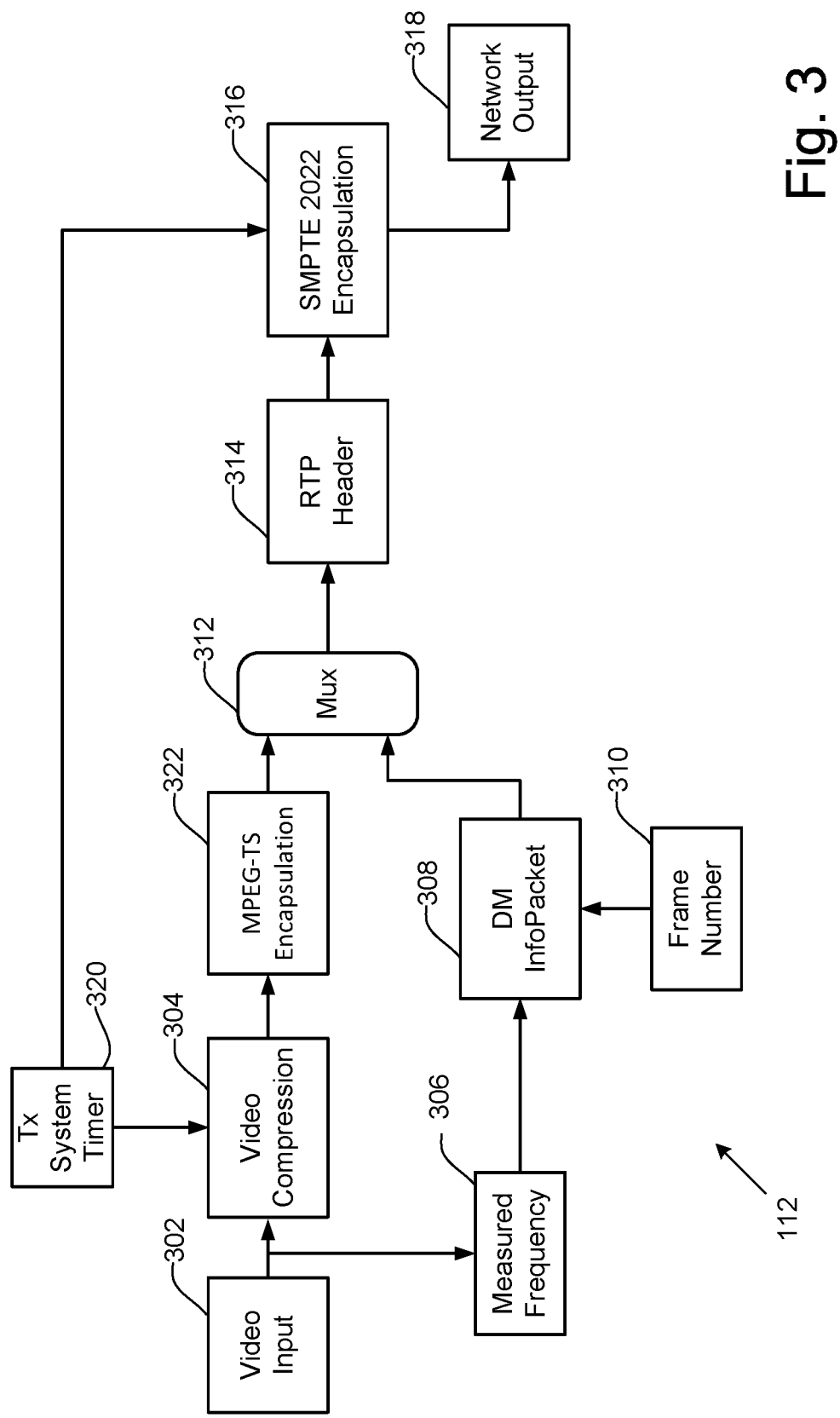
FIG. 3 is an illustrative block diagram of a video transmitter configured for transmitting compressed video, according to one embodiment of the invention.

Referring to FIG. 3, a block diagram of the transmitter 112 for transmitting compressed video is shown. The transmitter 112 includes video input 302, video compression module 304, measured frequency module 306, DM infoPacket module 308, frame number module 310, multiplexer module 312, Realtime Transfer Protocol (RTP) header insertion module 314, SMPTE 2022 encapsulation module 316, a Tx system timer module 320, an MPEG-TS encapsulation module 322, and network output module 318. In various embodiments, the above-listed modules are implemented using discrete integrated circuits, or in firmware programmed onto field programmable gate arrays (FPGAs), or a combination of both.

The video input 302 receives (from a video source 102) raw video along with synchronization pulses Hsync and Vsync. The video compression module 304 receives video and produces a compressed version of the video that is packetized and suitable for transmitting over UDP/IP using unicast, multicast, or broadcast addressing. The video compression module 304 also inserts Presentation Timestamps (PTS). The Tx system timer module 320 is a free running counter that serves as the transmitter 112 "time-base" (clock). The MPEG-TS encapsulation module 322 packetizes A/V content for network side transport payload while supporting a means of conveying both payload and transport layer specific metadata. The MPEG-TS encapsulation module 322 adds a Presentation Time-Stamp (PTS) overhead field to carry a payload content timestamp. The Tx system timer 320 is sampled to obtain timestamps marking the arrival of A/V content such as a video frame or audio samples, to be carried as metadata to one or more receivers 108 and aid in establishing play back timing. Additionally, the Tx system time 320 is sampled to obtain a timestamp to be carried as metadata in each network side packet (e.g., RTP over an IP network) used in the formation of a virtual constant bit rate conduit that will be used to transport packetized A/V content to the receivers 108. These timestamps provide a means of transferring the transmitter 112 time-base to receivers 108.

The measured frequency module 306 counts incoming pixel clocks using a fixed clock on the transmitter 112. This provides a measure of the incoming video pixel frequency. The frame number module 310 increments at the start of every frame (initial value is unimportant). DM InfoPacket creation module 308 creates a packet containing various parameters including, but not limited to, the measured frequency (from the measured frequency module 306), the frame number (from the frame number module 310), and AES encryption information, video format information, and pixel clock information. The multiplexer 312 switches between forwarding video packets or DM InfoPackets to the RTP header insertion module 314. The RTP header insertion module 314 adds a header to the video packets that includes a 90 kHz timestamp value. The SMPTE 2022 encapsulation module 316 adds Forward Error Correction (FEC) packets to the incoming stream so that the receiver 108 can correct errors. The SMPTE 2022 encapsulation module 316 also utilizes Real-Time Protocol (RTP) encapsulation supporting a timestamp field for each transport packet. The network output 318 outputs the IP packets from the transmitter 112. The IP packets are sent over a video distribution network and eventually received by a receiver 108. The process of transmitting compressed video is discussed in further detail below.

Figure 4:
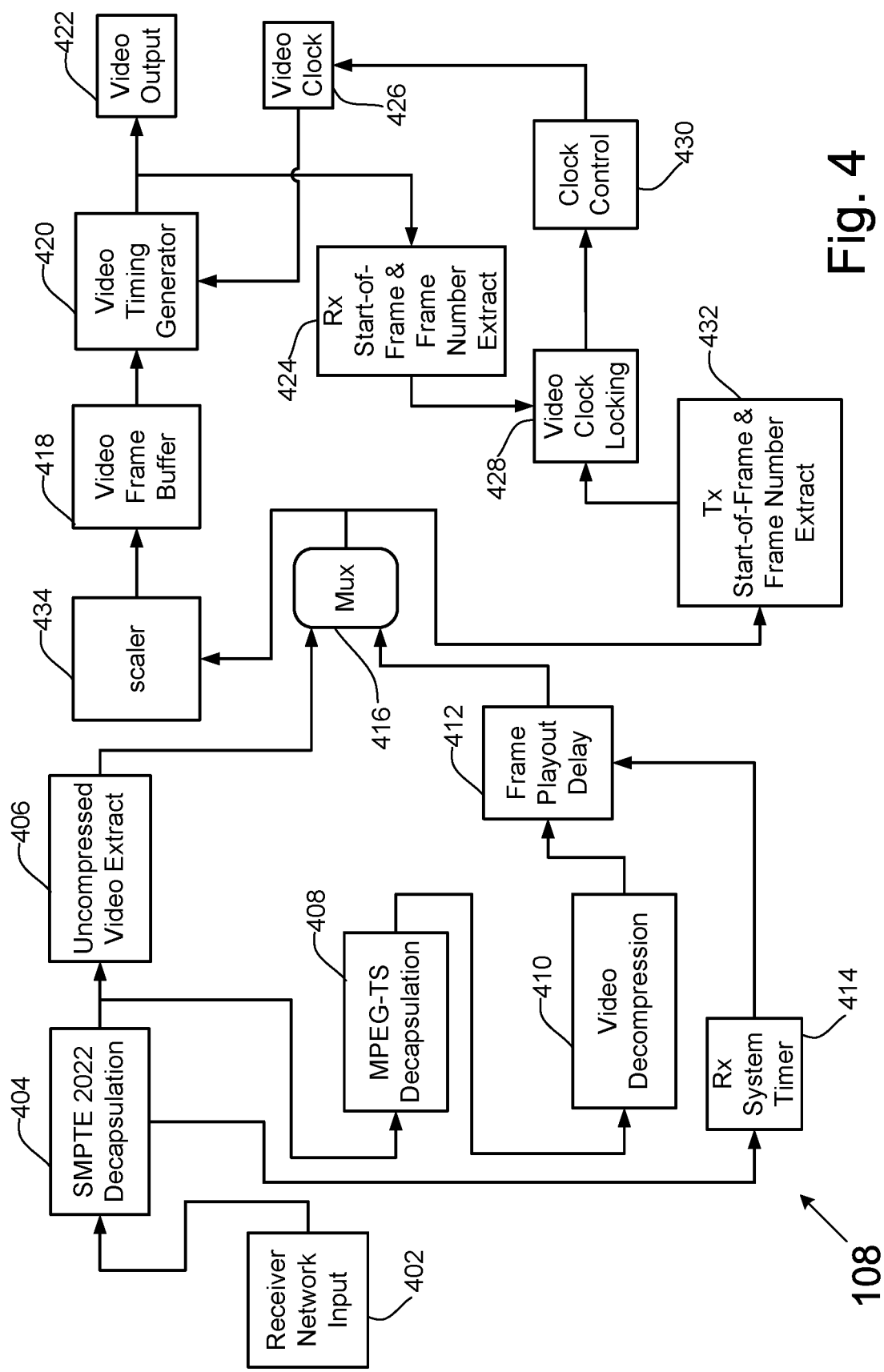
FIG. 4 is an illustrative block diagram of a video receiver, according to one embodiment of the invention.

Referring to FIG. 4, in one embodiment, a block diagram of a video receiver 108 is shown. The video receiver 108 includes a network input module 402, a SMPTE 2022 decapsulation module 404, an uncompressed video extraction module 406, a MPEG-TS decapsulation module 408, a video decompression module 410, a frame playout delay module 412, an Rx system timer module 414, a multiplexer module 416, a scaler module 434 a low-latency video frame buffer module 418, a video timing generator module 420, a Tx start-of-frame and frame number extraction module ("Tx SOF module") 432, an Rx start-of-frame and frame number extraction module ("Rx SOF module") 424, a video clock locking module 428, a clock locking module 430, a video clock module 426, and a video output module 422. In various embodiments, the above-listed modules are implemented using discrete integrated circuits, or in firmware programmed onto field programmable gate arrays (FPGAs), or a combination of both.

The network input 402 receives IP packets from the video distribution network. The SMPTE 2022 decapsulation module 404 performs error correction of any packet errors using the received FEC packets. As mentioned above, the input video to the video receiver 108 can include either uncompressed or compressed video. If the received video stream is uncompressed, the uncompressed video extraction module 406 receives packetized video and produces raw video samples. The raw video is passed through multiplexer 416 and on to the video frame buffer 418.

If the received video stream is compressed, the MPEG-TS decapsulation module 408 receives packets that contain MPEG Transport Stream and transmits an Elementary Stream (ES) compressed video to the video decompression module 410. The video decompression module 410 receives the Elementary Stream compressed video and produces raw video samples with Presentation Timestamps (PTS). The Rx system timer 414 monitors the transport layer timestamps extracted by the SMPTE 2022 decapsulation module 404, and uses them to produce a local time-base (counter for timestamp comparison).

The frame playout delay module 412 utilizes the local time-base created in the system timer 414, the timestamps (e.g. PTS) extracted by the SMPTE 2022 decapsulation module 404, and a configurable peak video processing delay to schedule the transfer of the decompressed video frame to the frame buffer 418 through the multiplexer 416. In essence, the frame playout delay module 412 is changing a variable delay into a constant delay, with the length of the constant delay being set to the maximum delay of the variable delay. For example, if the video decompression took anywhere from one (1) ms to four (4) ms (based on image complexity), the frame playout delay module 412 makes the delay through the video decompression a constant four (4) ms, regardless of the input. This has the effect of reducing the variability of ("smoothing"} the data rate of the decompressed video data and thereby prevents the clock locking algorithm downstream (in the clock locking module 428) from having to deal with wildly swinging top-of-frame times. The process of receiving compressed video is discussed in further detail below.

The scaler 434 receives video frames through the multiplexer 416. The scaler 434 changes the resolution (number of pixels across a line and lines down a frame) of a video frame. If the output resolution is larger than the input resolution (more pixels or lines generated at the output than received at the input), then the scaler is upsampling the frame. If the output resolution is smaller than the input resolution (less pixels or lines generated at the output than received at the input), then the scaler is downsampling the frame.

The actual scaling operation is performed using filters. An upsampling scaler uses an interpolation filter, which fills in new pixels in between existing pixels and new lines in between existing lines. A downsampling scaler uses a decimation filter, which removes any high-frequency horizontal pixels or vertical lines, before removing pixels or lines. These high frequencies would cause aliasing and image artifacts if not removed.

Because the scaler 434 needs to be able to switch between upsampling and downsampling at runtime, the scaler 434 utilizes a polyphase filter, which is a filter whose input samples are at different non-integer "phases" across the filter. This allows upsampling and downsampling with non-integer ratios.

The scaler decomposes the two-dimensional scaling operation into a horizontal scale function and a vertical scale function. To perform horizontal scaling, previous input pixels must be stored to apply to the input of the horizontal filter. To perform vertical scaling, previous input lines must be stored to apply to the input of the vertical filter.

When upsampling, performing the vertical scale first will minimize the amount of memory needed to be stored in line buffers, since the vertical filter is storing shorter (input) lines. When downsampling, the converse is true—performing the horizontal scale first will minimize the amount of data needed to be stored in the line buffers. The scaler's overall quality depends on the quality and length of the filters.

The scaler 434 does not affect the rate of the video passing through it. Each frame that arrives at the input to the scaler 434 generates one frame on the output. There will be a fixed delay through the scaler 434 due to line and pixel buffers needed for vertical and horizontal filtering, but this is much smaller than a frame (typically less than a dozen lines).

The low-latency video frame buffer 418 receives video frames from the scaler 434 and transmits those video frames when requested. The low-latency frame buffer is designed for Networked Video Transmission (NVT) devices, and is discussed in further detail below with respect to FIG. 6.

The Tx SOF module 432 extracts from of the video stream at the input of the scaler 434 the Tx start-of-frame signal (Tx_top_of_frame) and Tx frame number (Tx_frame_num) associated with that Tx start-of-frame. These outputs require no knowledge of video resolution or format. The video clock 426 provides the pixel clock to the video timing generator 420 for the video output. In one embodiment, the video clock 426 frequency can be incremented and decremented in increments as small as one part-per-million (1 PPM). The video timing generator 420, using the pixel clock from video clock 426 as a reference, clocks video out of the frame buffer 418 at the correct time within a frame (i.e., during the active video region) and generates the synchronization pulses Hsync and Vsync. The Rx SOF module 424 extracts from the video stream at the output of the video timing generator 420 the Rx start-of-frame signal (Rx_top_of_frame) and Rx frame number (Rx_frame_num) associated with that Rx start-of-frame. Again, these outputs require no knowledge of video resolution or format.

The video clock locking module 428 receives start-of-frame and frame number from both the Tx SOF module 432 and the Rx SOF module 424, synchronizes the video output to the input timing (output locking) and adjusts the output clock ("adjust clock frequency" sent to the clock control module 430) so that the delay through the video frame buffer 418 is a constant (sub-frame) value. This output locking must appreciably smooth any input variability so as to generate a video output that is acceptable to the downstream video sink. The video clock locking module 428 requires the total number of clocks per output frame, which is used to calculate the count_per_clock parameter (discussed below). No other parameters of video resolution, frame rate, or format are required. The clock control module 430 converts/translates the logical clock increment/decrement commands (adjust clock frequency) from the video clock locking module 428 into the actual commands (control signals) needed for the video clock 426. The video clock 426 produces an Rx video clock (pixel clock) that is used as the source for the video timing generator 420, which reads video pixels from the frame buffer 428 to the video output 422. The video output 422 sends raw video with synchronization pulses (Hsync, Vsync) to the display 110.

Figure 5:
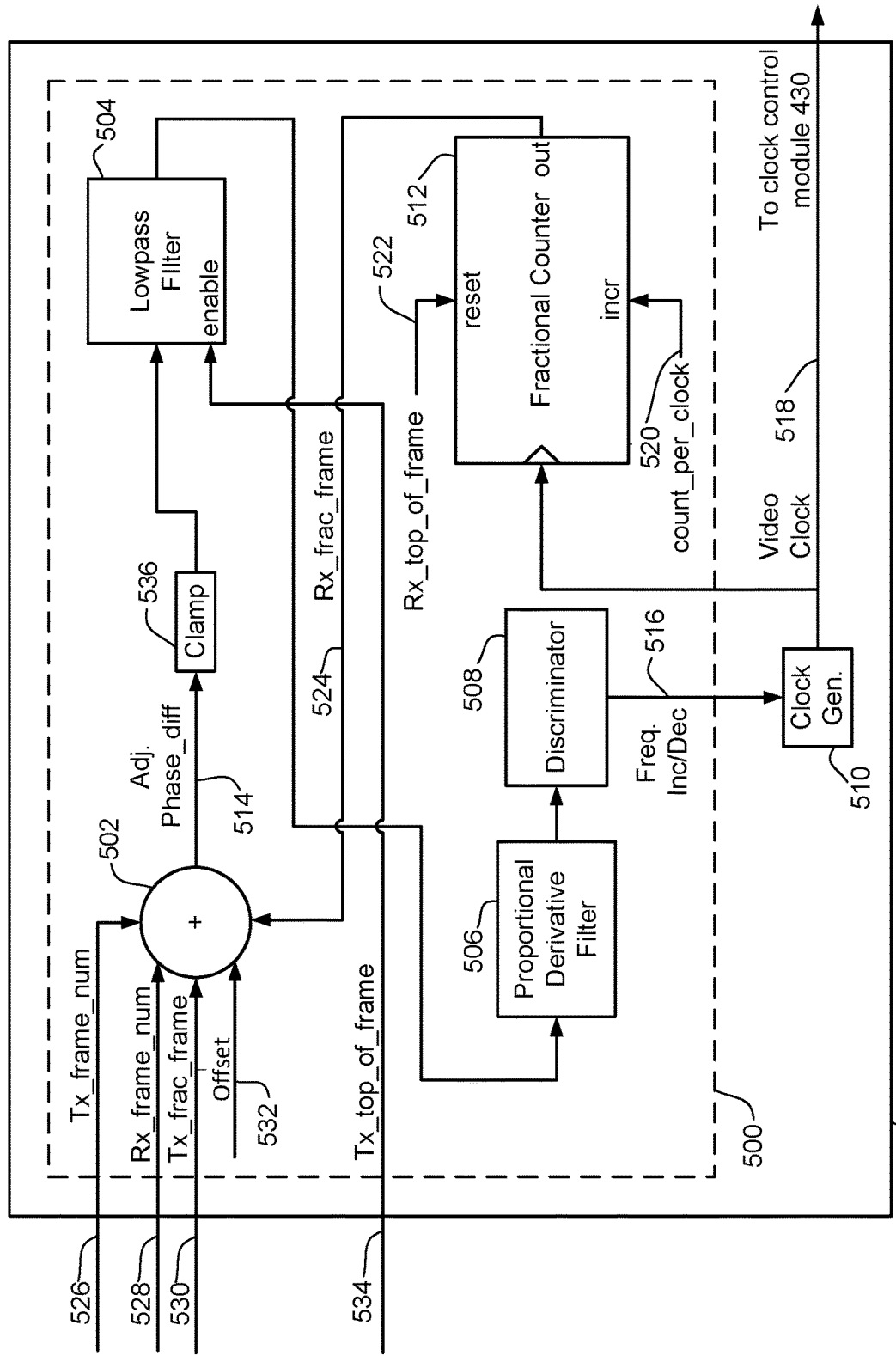
FIG. 5 is an illustrative block diagram of a video clock locking module, according to one embodiment of the invention.
Figure 7:
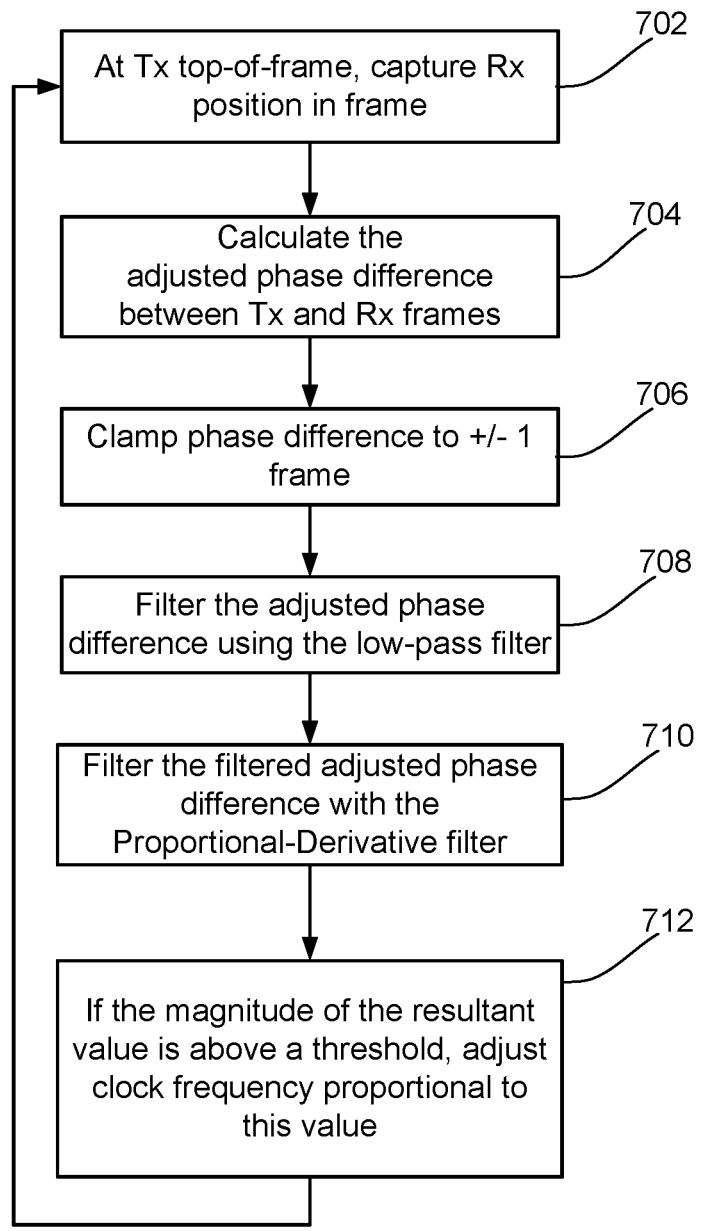
FIG. 7 is an illustrative flow diagram of a method for video clock locking, according to one embodiment of the invention.

Referring to FIGS. 5 and 7, in one embodiment, a block diagram of the video clock locking module 428 is shown. The video clock locking module 428 includes a phase lock loop module 500 and a clock generator 510. In one embodiment, the phase lock loop module 500 includes a summer module 502, a clamp module 536, a low-pass filter module 504, a proportional derivative filter (PD) module 506, a discriminator module 508, a fractional counter module 512, an offset register for storing an offset value 532, and a count_per_clock register for storing a count_per_clock value 520.

The phase lock loop module 500 is a phase-locked-loop (PLL) that receives input timing information from the Tx SOF module 432 and the Rx SOF module 424. Specifically, the phase lock loop 500 receives Tx_top_of_frame 534 (start of input frame) and Tx_frame_num 526 (input frame number) from the Tx SOF module 432, and receives Rx_top_of_frame 522 (start of output frame) and Rx_frame_num 528 (output frame number) from the Rx SOF module 424.

The arrival of Tx_top_of_frame 534 triggers the sequence of clock locking steps, and is defined as having an input fractional phase (Tx_frac_frame 530) of zero (0). At the time of arrival of the input frame (i.e., arrival of Tx_top_of_frame 534), the output frame number (Rx_frame_num 528) and output fractional phase (Rx_frac_frame 524) is captured by the summer module 502 (Step 702). The output fractional phase is a number from zero (0) to one (1) in a forty-eight (48) bit fixed point notation, and represents the fraction of the output frame that has been sent at the arrival of the input frame.

The summer 502 makes the following calculations (Step 704).

For the phase difference:

Tx_frame_num.Tx_frac_frame−Rx_frame_num.Rx_frac_frame=Phase_Diff    a., where Tx_frame_num and Rx_fram_num are the integer part, on the left of the decimal point; and Tx_frac_frame and Rx_frac_frame are the fractional part, on the right side of the decimal point.

For the adjusted phase difference:

Phase_Diff−Offset=Adj_Phase_Diff    b.

The offset 532, which is stored in a local memory register, is configurable target difference between read and write frame pointers. The offset 532 is subtracted from the phase difference (i.e., Tx_frame_num.Tx_frac_frame−Rx_frame_num.Rx_frac_frame), allowing for the PLL to lock with a zero phase difference when the input and output frames are at a fixed phase offset from each other. This parameter allows the adjustment of the fixed delay between the input and output frames.

The adjusted phase difference is passed to the clamp module 536 where the adjusted phase difference is clamped to +/−1 frame (Step 706). The output of the clamp module 536 is passed to the low-pass filter 504, which removes input phase jitter caused by the encoding or compression, any forward error correction, packetization, network delay, and decoding or decompression (Step 708).

The output of the low-pass filter 504 is passed to the Proportional-Derivative (PD) Filter 506, which compensates for the integrator in the clock generator 510 (Step 710). Since the clock generator 510 stores the generated clock frequency with no additional input required, it is a pure integrator. This integrator in the loop must be compensated for by the derivative term in the PD filter 506 to achieve loop stability. The derivative term is the difference between the values of the filtered phase differences from the current and previous frames.

The discriminator module 508 receives the filtered adjusted phase difference ("resultant value") from the PD filter 506 and makes the decision as to whether the frequency of the clock generated by the clock generator module 510 needs to be increased or decreased, or remain unchanged (Step 712). The discriminator module 508 contains a dead band (a range between −threshold and +threshold), which requires the accumulation of enough phase difference before triggering the frequency change. If the absolute value of the phase difference is greater than a fixed threshold, the clock frequency is changed. If the absolute value of the phase difference is less than or equal to a fixed threshold, the clock frequency is left unchanged. The threshold is a fixed value empirically determined to keep the clock frequency from switching between two values every frame interval.

Since the frequency is changed incrementally, the discriminator module 510 also generates the required number of frequency change commands based on the magnitude of the filtered phase difference. The discriminator module 510 also clamps the frequency change to be within +/−1000 ppm of the nominal frequency. This maintains a video clock within the HDMI specification to the output while performing the output locking.

The clock generator module 510 outputs a clock with a frequency that can be adjusted up or down in discrete values by the discriminator module 508. The clock generator module 510 maintains its frequency after adjustment without any further input. The clock output of the clock generator module 510 is sent to the fractional counter module 512 and to clock control module 430, which is discussed above.

The fractional counter module 512 counts from 0 to 1 in 48-bit fixed point over an entire output frame. The increment value for this counter is called count_per_clock 520, which is added to the fractional counter for every pixel clock tick, and is calculated as $2^{48}$/clocks-per-frame. After one frame's time, the fractional counter would have counted one frame's worth of count_per_clock values. In other words, the value in the fractional counter would be $2^{48}$, or 1.0 in fixed-point notation. The fractional counter module 512 is reset to 0.0 at the output start-of-frame (Rx_top_of_frame 522), and the entire process repeats. This counter provides the fractional frame phase (Rx_frac_frame 524) to the summer module 502.

Figure 8:
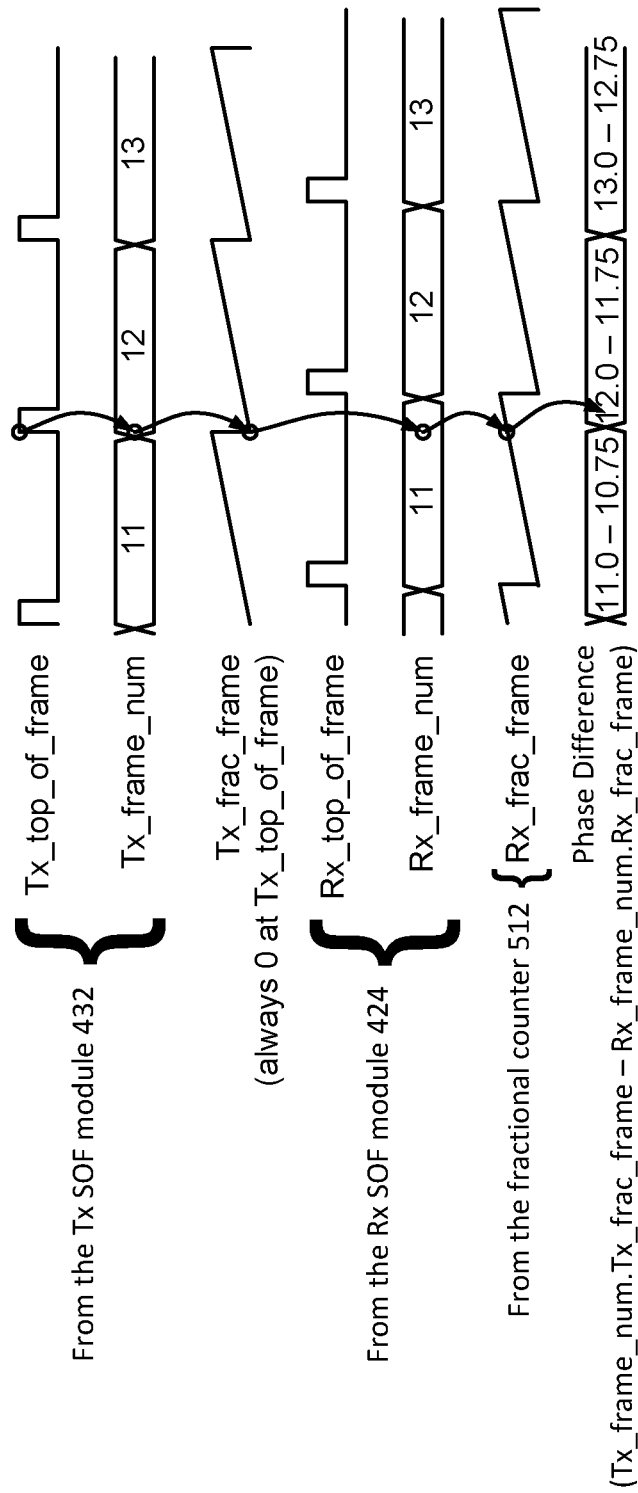
FIG. 8 is an illustrative timing diagram of phase-locked loop signals, according to one embodiment of the invention.

A timing diagram of phase locked loop module 500 signals is shown in FIG. 8.

Figure 6:
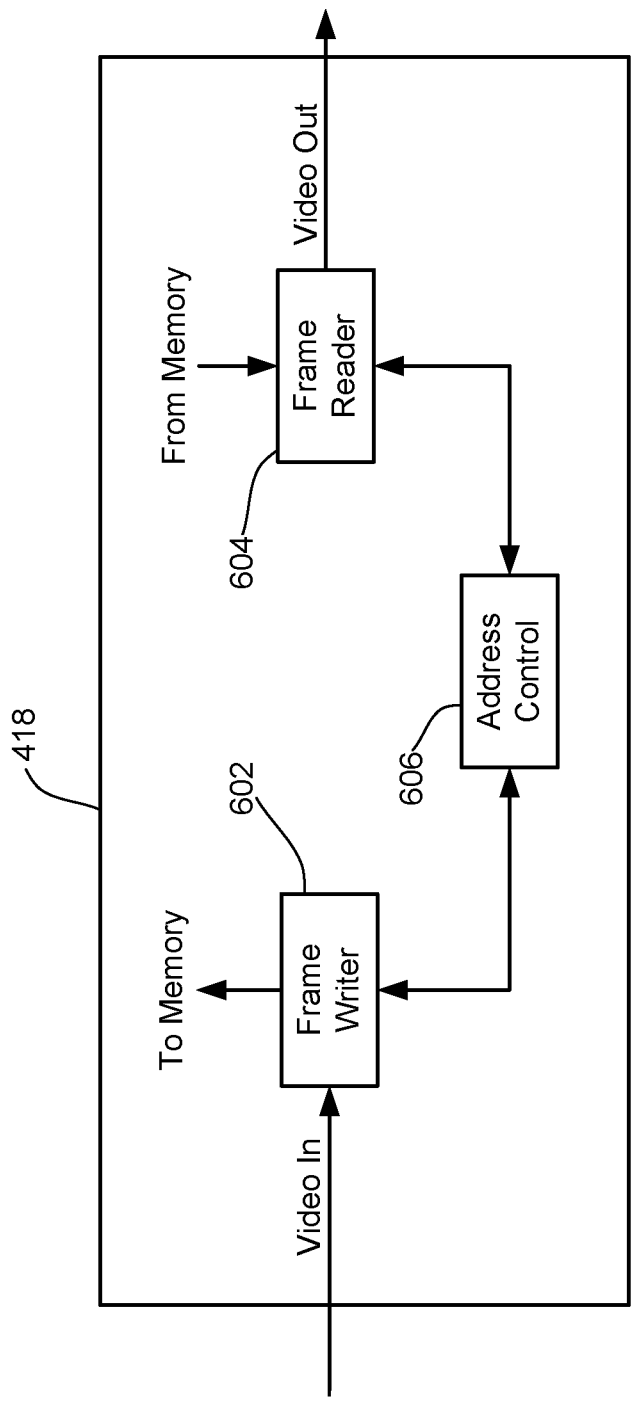
FIG. 6 is an illustrative block diagram of a video frame buffer, according to one embodiment of the invention.

Referring to FIG. 6, in one embodiment, a block diagram of the frame buffer 418 is shown. The frame buffer 418 is subdivided into three major components including a frame writer module 602, a frame reader module 604, and address control module 606.

The frame buffer 418 has an input-to-output granularity of one line of a frame, which is necessary to support low latency through the system. In addition, any input timing variability must be absorbed by this buffer so that the output may remain smooth and synchronized to the original input video at the transmitter.

The frame writer module 602 receives video pixels, formats the video pixels into memory-sized words, and writes the words to memory located in the receiver 108. At the start of every frame, the frame writer module 602 receives the start-of-frame write memory address from the address control module 606, and provides its current write memory address to the address control module 606 during the writing of the frame. The frame writer module 602 also supports aborting the writing of a frame if the address control module 606 determines that the current write frame will potentially overtake the current read frame.

The frame reader module 604 reads memory-sized words of data from memory, segments the words into pixels, and transmits the pixels out of the frame buffer 418. At the start of every frame, the frame reader module 604 accepts a start-of-frame read memory address from the address control module 606, and provides its current read memory address to the address control module 606 during the reading of the frame. Once the frame reader module 604 begins reading a frame, it continues until the frame is complete.

The address control module 606 manages the read and write start-of-frame addresses for the frame writer module 602 and the frame reader module 604. When the frame writer module 602 or the frame reader module 604 reaches the end of a frame, the start-of-frame address for the next frame is computed and sent to the respective module. This start-of-frame address may be modified by skip-and-repeat logic, which is described herein below. The address control module 606 also monitors the instantaneous read address of the frame reader module 604 and write addresses of the frame writer module 602. If the address control module 606 determines that the write frame will overtake the read frame, the address control module 606 will abort the writing of the frame in progress.

If skip-and-repeat mode is enabled, then the address control module 606 enforces a frame skip rule and a frame repeat rule. If the write frames are arriving faster than the read frames, the write address will slowly advance on the read address. A frame skip is generated when the write address reaches a fixed offset from the read address. When the frame skip occurs, the write frame is immediately aborted and the write start-of-frame address is not advanced, causing the next write frame to overwrite the aborted frame. This guarantees that even if the write frame time is much faster than the read frame time, the write address will never overtake the read address.

If the read frames are arriving faster than the write frames, the read address will slowly advance on the write address. When the end of a read frame is reached, a check is performed to determine if the next read frame would be on the same frame as the current write frame. If so, then the read start-of-frame address is not advanced, causing the read frame to be repeated and not to overtake the write frame. This guarantees that even if the read frame time is much faster than the write frame time, the read address will never be allowed to overtake the write address. Note that this forces the minimum frame delay to a little more than 1 frame, since the read frame is never allowed to be on the same frame as the write frame. It should be noted that this is only one implementation of a frame skip/repeat function. In other embodiments, other implementations can perform an equivalent function.

For low latency mode (and to achieve a sub-frame latency), skip and repeat mode must be disabled, allowing the read frame to be on the same frame as the write frame.

Additionally, a warning is triggered if the monitored frame buffer delay is insufficient to absorb input variability. This allows fine tuning of this latency. This allows the system to dynamically adjust the latency to be as low as possible given the system and network parameters. As mentioned above, input video to the video receiver 108 can include either uncompressed or compressed video. If the input is uncompressed, the input can include video frames or packets of information that include the required components to reconstitute the video, as discussed above. If the input video is compressed, then some indication of frame number and start-of-frame needs to be inserted into the compressed stream by the transmitter 112 so it can be extracted at the receiver 108.

Video Compression/Decompression introduces variable (nominal+/−jitter) delays in transmitters and receivers respectively. The configuration parameter/modes for these processes, and to some extent, content complexity, influence the magnitude of both the fixed and time-varying delays.

Audio delays are generally much shorter than that of the video delays. At the receiver's output port, audio delay must be added to the audio content so as to align with video within known tolerances, in order to achieve acceptable lip-sync performance.

The matrix based SMPTE 2022-1/2 frame reordering and forward error correction (FEC) processing at the receiver units 108 introduce frame arrival jitter, the magnitude of which, is proportional to the real-time transfer protocol (RTP) Packet Size, RTP constant bit rate (CBR) rate, and the matrix size (size of a two-dimensional array of packets). Matrix size and RTP CBR rate are configured at the transmitter 112.

In various embodiments, disclosed are methods for managing video compression (i.e., encoding) jitter at the transmitter 112 to produce a nearly constant inter-frame period into the RTP encapsulation process; tracking and conveying to the receiver 108, audio and video time association information; calculating, and compensating for SMPTE 2022 Decapsulation delay; and managing video decompression (i.e., decoding) jitter at the receiver 108 to produce a nearly constant inter-frame period, and delay toward the output of the video frame buffer 418. The disclosed methods involve using timestamps and synchronized time-bases between transmitters 112 and receivers 108.

Referring again to FIGS. 3 and 4, the system timer 320 is a counter incrementing at a nominal rate of 90 KHz and traceable to a local clock with a +/−50 ppm frequency stability. This counter is used to timestamp audio and video information as it enters the transmitter 112. These timestamps are mapped in the MPEG2-TS PES Presentation Time Stamp overhead fields of the packets that carry the associated content to the receiver 108.

This input timestamping of both audio and video provides a means of tracking the time association of specific audio and video packets. This can be used at the receiver 108 to determine whether or not any delay (generally audio delay) needs to be added for proper lip-sync. In addition to the above, the system timer 320 directly sources the RTP timestamp overhead field carried in all packets exiting the SMPTE 2022 encapsulation module 316. This approach provides a CBR based mechanism to convey the transmitter 112 system time-base to the receiver 108.

As the start of each video frame reaches the compression module 304 (encoder), the frame is marked with a timestamp traceable to the system timer 320. This timestamp passes through the compression module 304 as metadata. At the output of the compression module 304, the timestamp is visible to the MPEG2-TS encapsulation module 322 coincident with the first words of the frame's compressed code-stream. The compression module 304 output is a pull-interface (i.e., the recipient of the compression module 304 output, i.e., MPEG2-TS encapsulation module 322, controls when any data available for output at the compression module 304 is ultimately transferred). Until such time, the compression module 304 buffers the data. As such, the MPEG2-TS encapsulation module 322 has the ability to delay, by a configurable amount, the commencement of the code-stream transfer so as to make use of the compression module 304 compressed image storage RAM as a de-jittering buffer. The peak magnitude of the compression module 304 delay is a function of the compression module 304 design and chosen configuration parameters. The delay includes: a fixed compression delay for any frame/sub-frame, and a variable, yet bounded, compression delay due to entropy differences across different frames/sub-frames. Compression at a sub-frame level allows for a portion of the image to be compressed and transferred without having received the entire image.

Code-stream transfer is initiated by the MPEG2-TS encapsulation module 322 when the system time reaches a value that is at least equal to the sum of the timestamp and the configured delay value. This process results in the transfer of code-streams at a constant period. Upon reading out each frame, the MPEG2-TS encapsulation module 322 copies the frame's timestamp into Packetized Elementary Stream (PES) packet's presentation timestamp (PTS) field, ultimately making it visible to the receiver 108 decapsulation process.

In another embodiment, code-stream transfer may be initiated by the MPEG2-TS encapsulation module 322 at any point at which sufficient data is available to fill the payload region of a packet, provided that the receiver 108 must have sufficient buffer capacity to absorb both compression and decompression jitter. Operation at the receiver 108 is otherwise unaffected.

The receiver 108 system timer module 414 seeks to phase lock to the time-base sent by the transmitter 112 over RTP by monitoring the packet overhead as it exits the SMPTE 2022 decapsulation module 404. The packet stream, while having a constant bit rate, can be bursty and increasingly so at lower values of configured transport CBR bandwidth. The reason being that the SMPTE operation completes/outputs data only upon reception of (or correction of, or timeout of) the full complement of packets required to fill a matrix. Furthermore, the delay through the SMPTE 2022 decapsulation module 404 increases at lower CBR bandwidths and/or larger matrix sizes.

The design approach taken in extracting timing filters out the phase errors induced by the packet bursts, automatically adapts to a time base that is equal to the maximum delay through the SMPTE decapsulation process, and compensates for frequency offset between the local oscillators in the transmitter 112 and the receiver 108.

Figure 9:
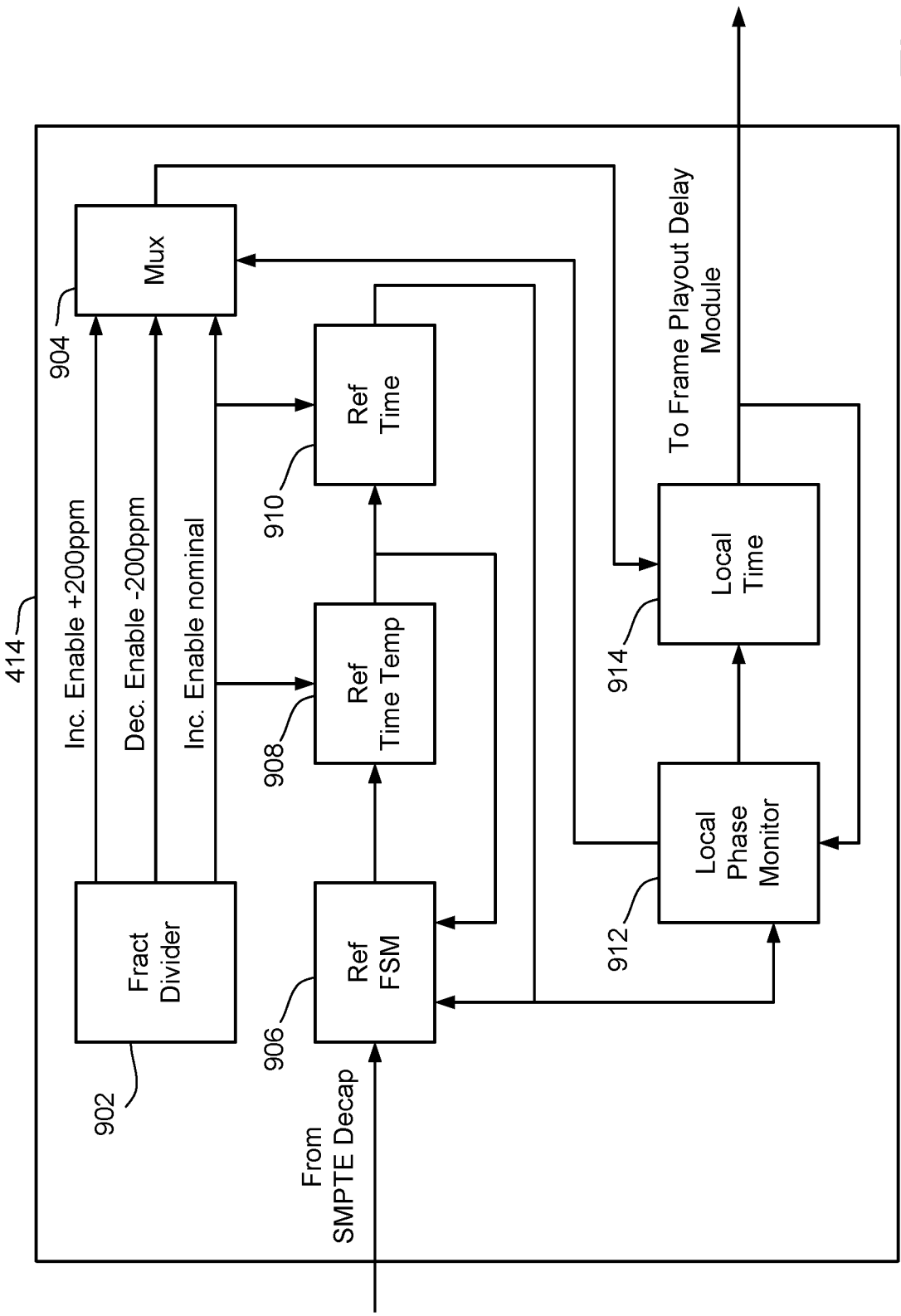
FIG. 9 is an illustrative block diagram of an Rx system timer module, according to one embodiment of the invention.
Figure 10A:
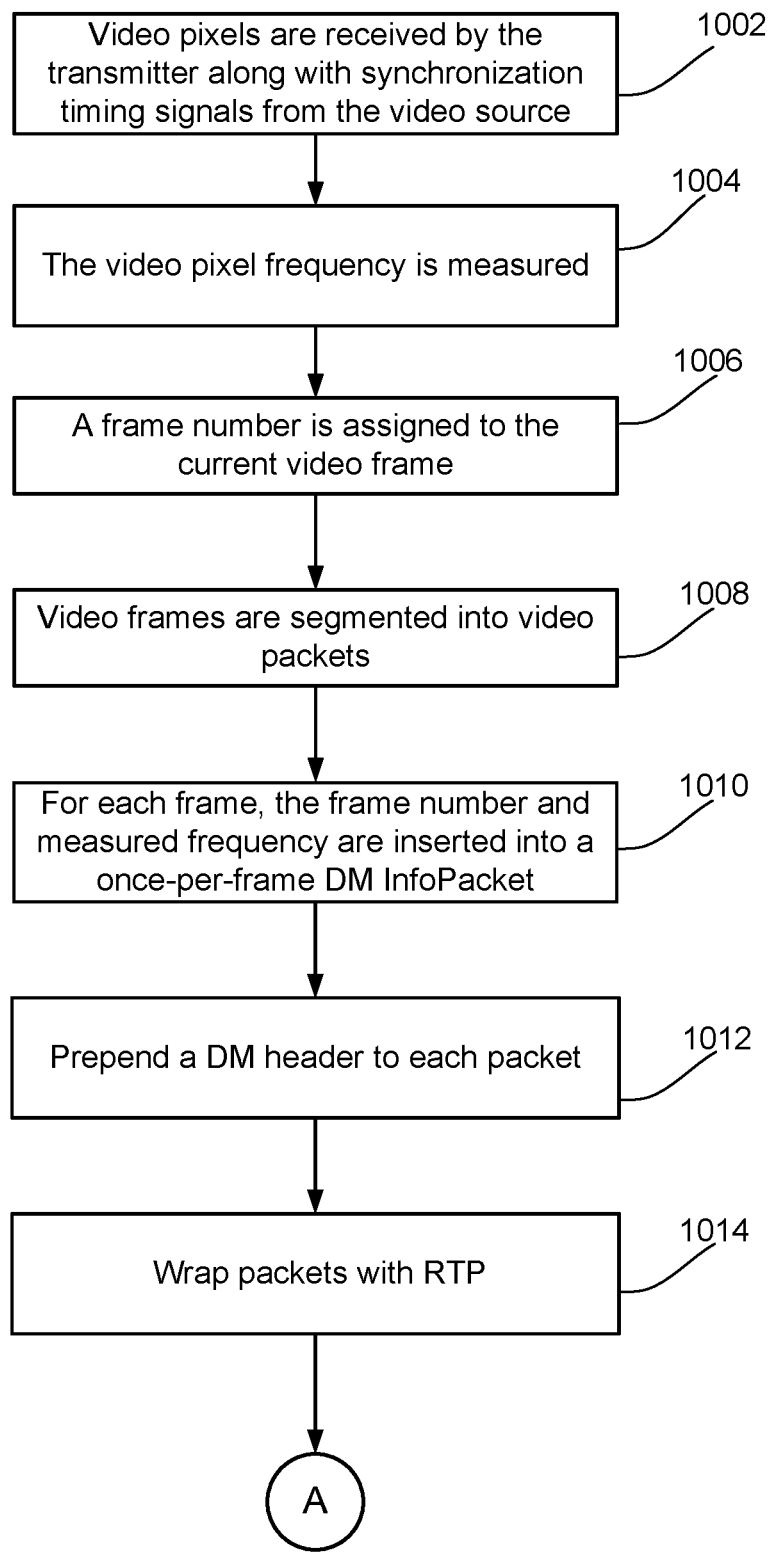
FIGS. 10A-D are illustrative flow diagrams of transmitting uncompressed video from a transmitter, over a network, to a receiver, according to one embodiment of the invention.
Figure 10B:
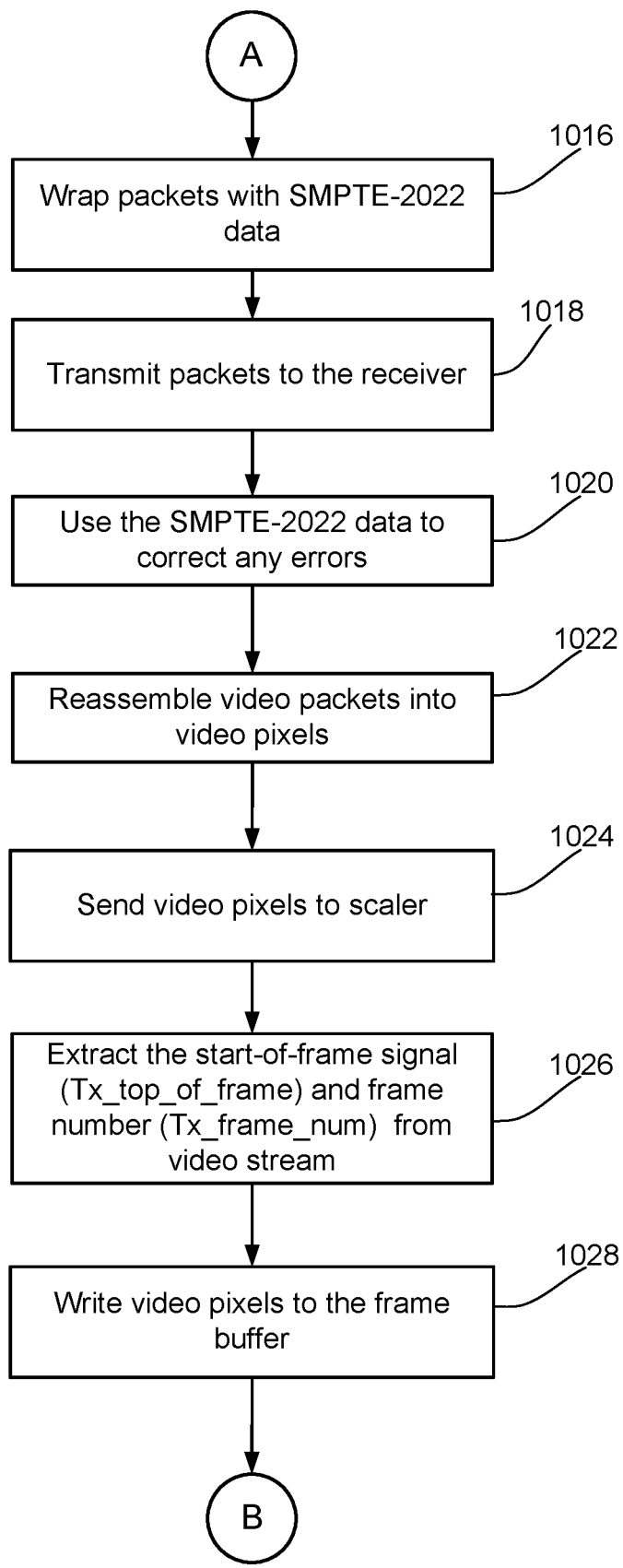
Figure 10C:
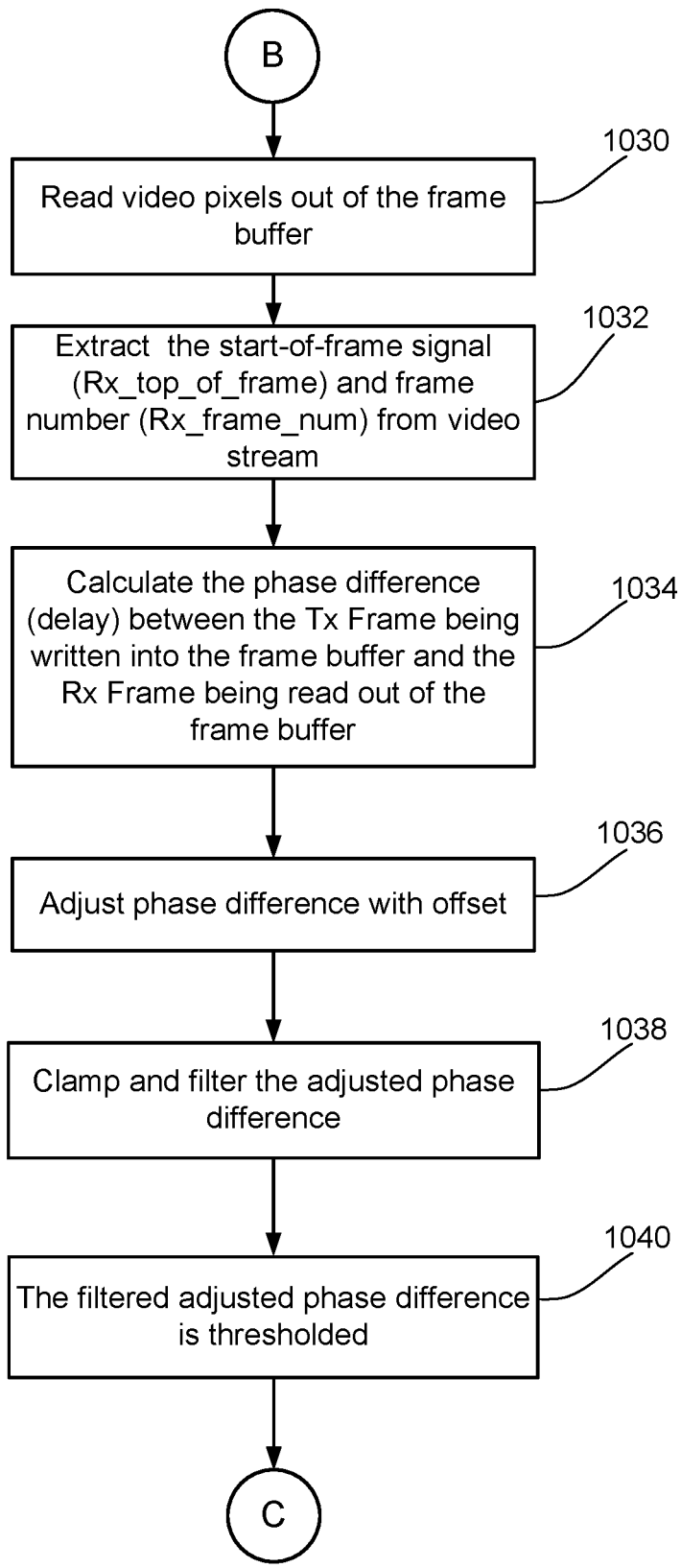
Figure 10D:
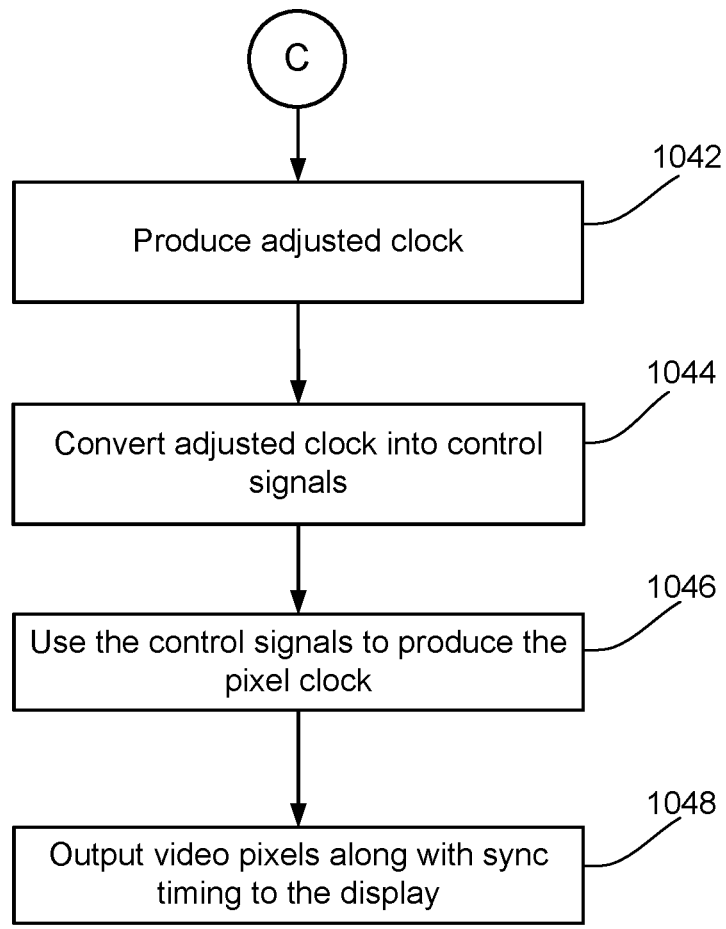
Figure 11A:
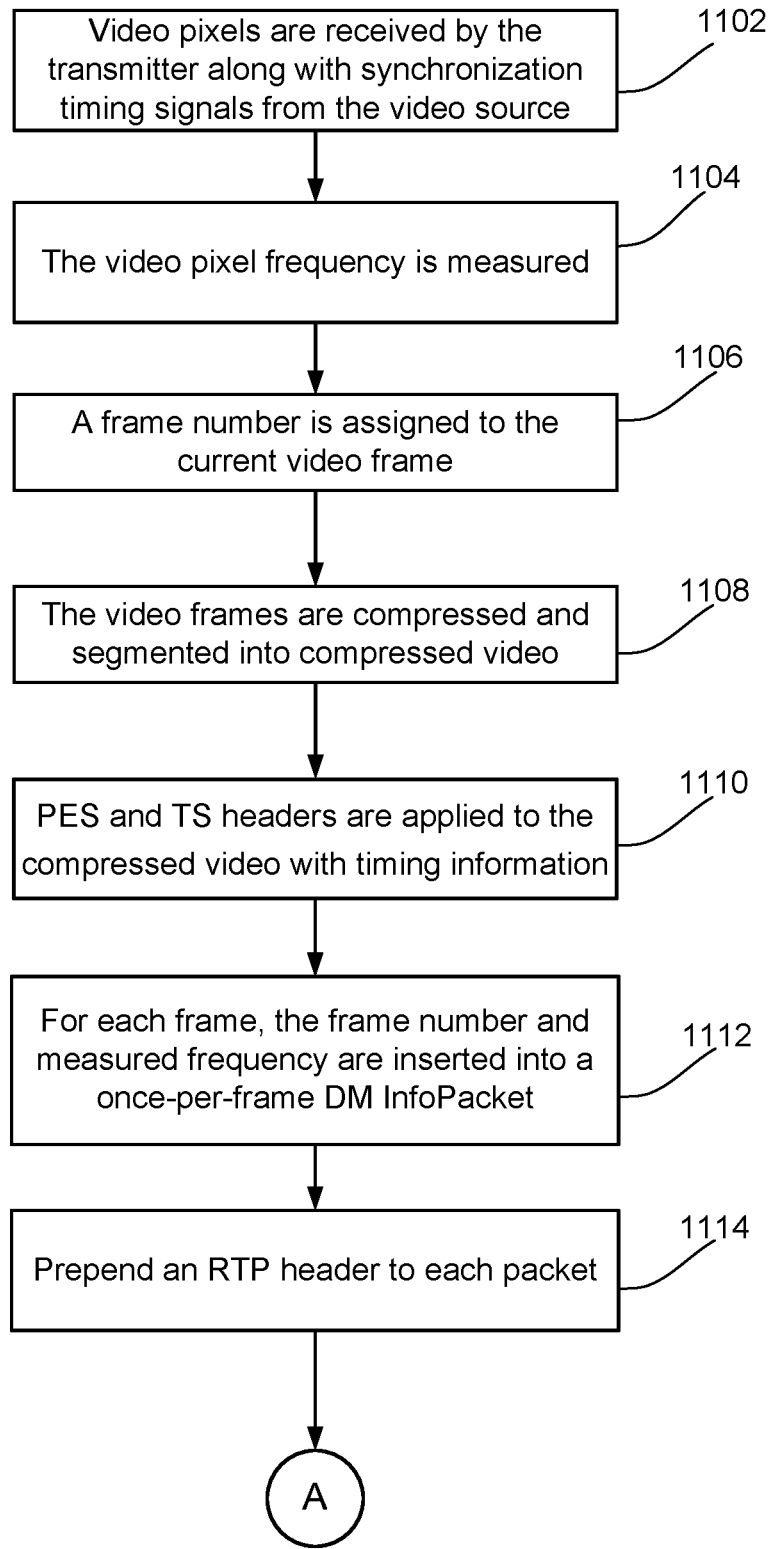
FIGS. 11A-D are illustrative flow diagrams of transmitting compressed video from a transmitter, over a network, to a receiver, according to one embodiment of the invention.
Figure 11B:
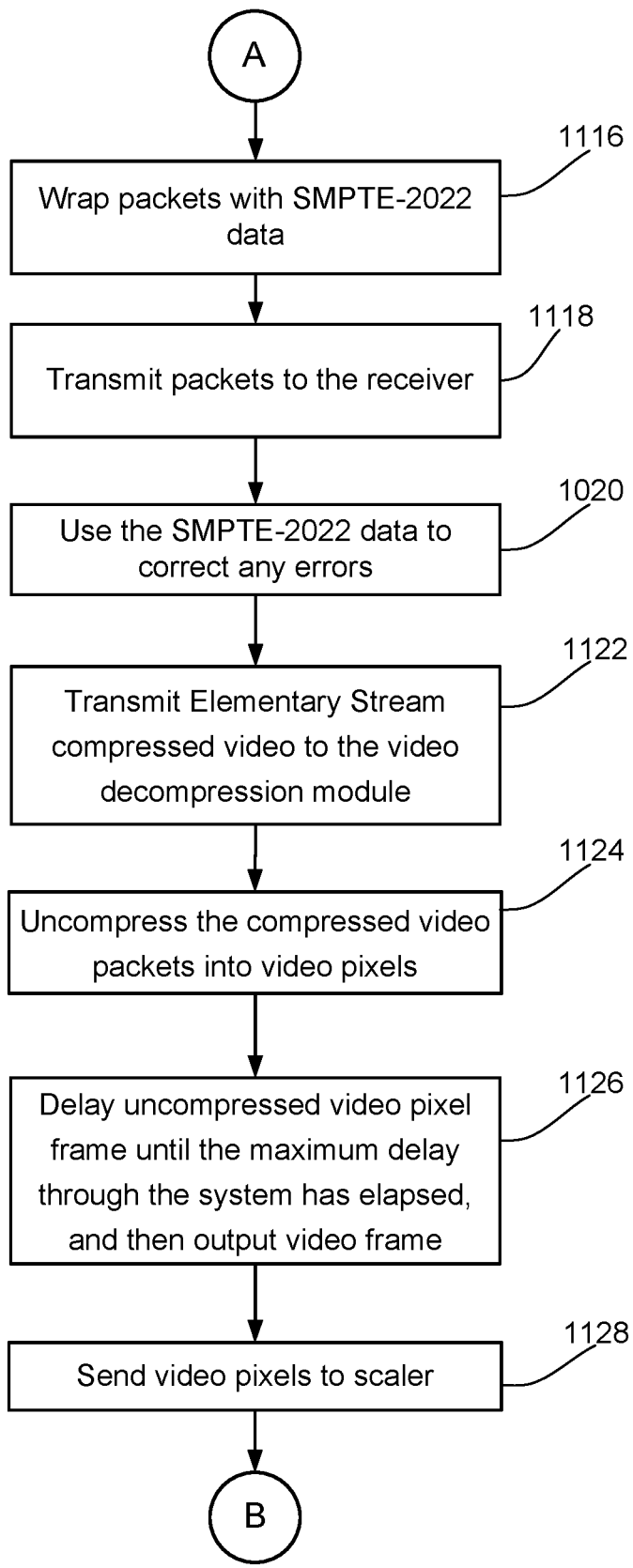
Figure 11C:
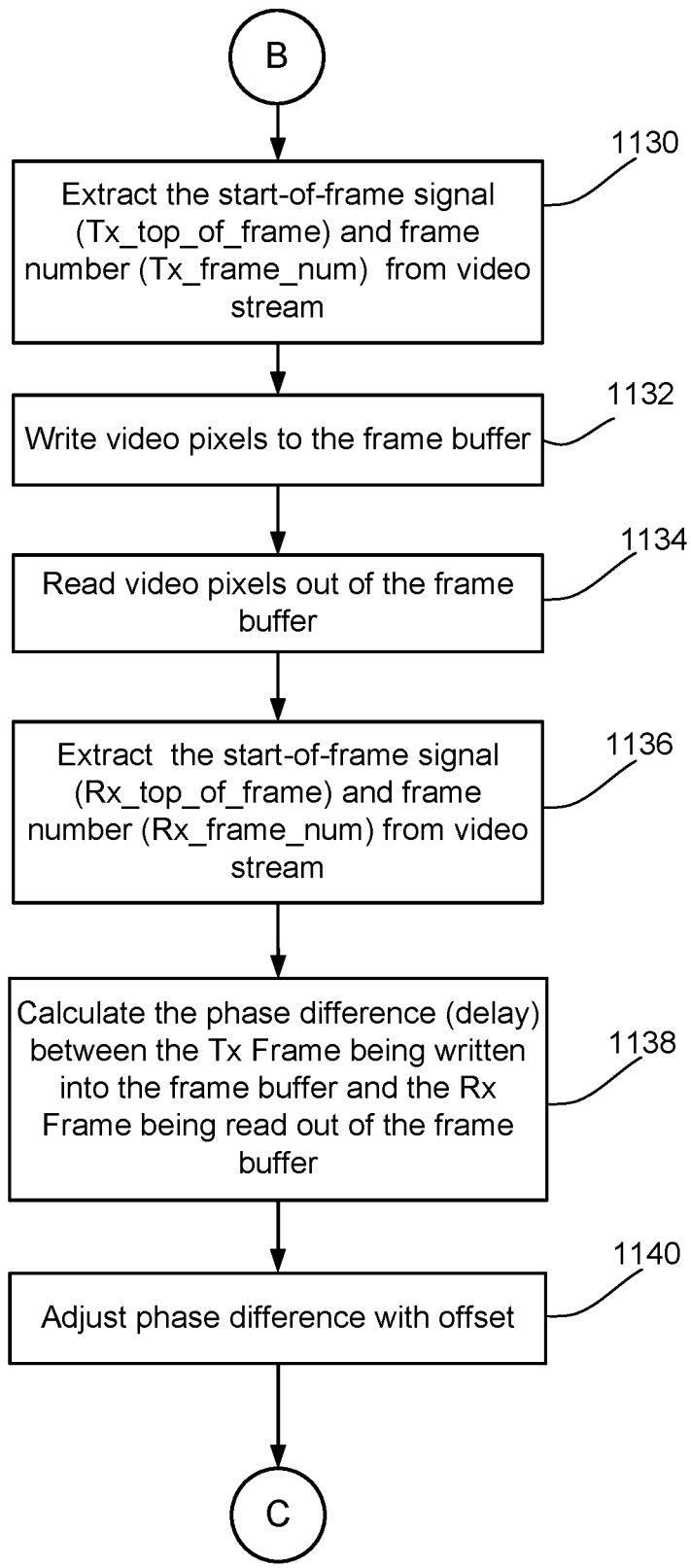
Figure 11D:
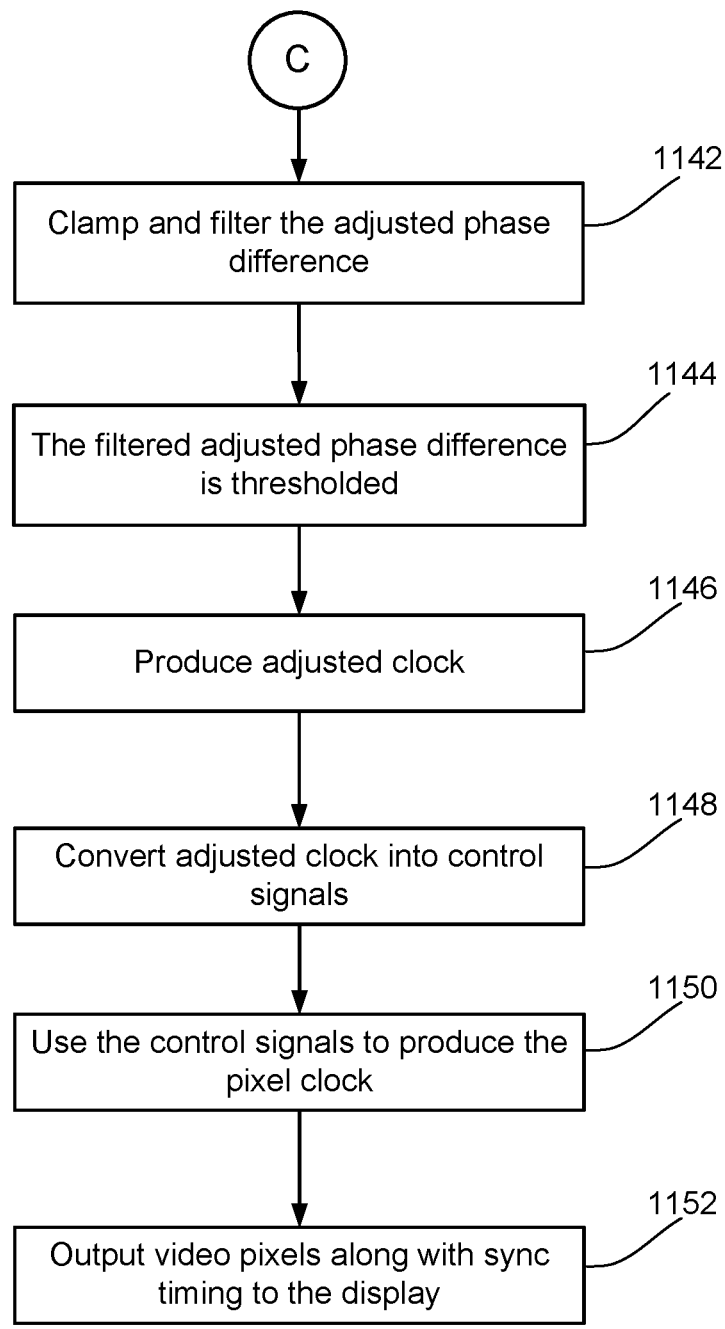

Referring to FIG. 9, in one embodiment, block diagram of the video receiver 108 Rx system timer module 414 is shown. As mentioned above, the Rx system timer 414 monitors the transport layer timestamps extracted by the SMPTE 2022 decapsulation module 404, and uses them to produce a local time-base (counter for timestamp comparison). The time module 414 includes a fractional divider module 902, a multiplexer 904, a reference time finite state machine (FSM) module 906, a reference time temp (temporary) module 908, a reference time module 910, a local phase monitor 912, and a local time module 914.

The Rx system timer module 414 is divided into two primary subsections. The first subsection is the reference timer subsection, and the second subsection is the local timer subsection. These two subsections represent the reference and feedback portions of a digital PLL.

The fractional divider module 902 receives input timing from a local oscillator reference clock (not shown) and divides the clock down to produce three output timing pulses. One of the outputs pulses at an average rate of 90 KHz+0 ppm, a second of the outputs pulses at an average rate of 90 KHz+200 ppm, and a third of the outputs pulses at an average rate of 90 KHz−200 ppm. The frequency stabilities of 0, +200, and −200 ppm are all relative to the stability of the local oscillator.

The multiplexer 904 is controlled by the local phase monitor 912 to select which one of the three outputs from the fractional divider 902 is to be used as the increment pulse for the counter in the local time module 914. For example, if the counter in the local time module 914 lags (is behind) the count in the reference time module 910, the local phase monitor 912 will select the enable that is +200 ppm until the local time module 914 counter catches up, which is discussed in detail below.

The reference time finite state-machine (FSM) module 906 monitors sequential timestamps entering from a configurable number (N) of RTP packets in order to choose the best time phase that represents the longest path through the SMPTE processing. While determining this, reference time FSM 906 keeps track of the best candidate in the reference time temp module 908.

After processing all N timestamps, the reference time FSM 906 makes the decision to transfer the updated time phase from the reference time temp module 908 to the reference time module 910, which makes it visible to the local phase monitor 912 for phase offset adjustment. Note that in between updates, both the reference time temp module 908 and the reference time module 910 are incremented at a 90 KHz nominal rate traceable to the free running oscillator on the receiver 108. This oscillator is +/−50 PPM actual stability and therefore, in the worst case, can be as much as 100 ppm offset from that of the transmitter 112. Since the processing/update windows are quite short (e.g. ~11 ms for a 100 Mbps CBR stream, consisting of 1400 B packets, feeding a one-hundred (100) packet matrix), the additional phase error introduced between updates is for all practical purposes, zero (0).

At the start of the "N packet" observation window, the reference time FSM 906 loads the first timestamp into a counter in the reference time temp module 908. The reference time temp module 908 then continues to increment its counter using the nominal (90 KHz+0 ppm) increment enable from the fraction divider 902. For each subsequent packet, the reference time FSM 906 compares the incoming timestamp to the timestamp stored in the reference time temp module 908. If the value of the incoming timestamp is less than the stored timestamp, then the incoming timestamp is loaded into the reference time temp module 908. If the value of the incoming timestamp is not less, the reference time temp module 908 simply increments its internal counter at the nominal rate. When the observation window completes, the timestamp stored in the reference time temp module 908 is transferred to the reference time module 910 provided that all timestamps and sequence numbers received in the window were in incrementing order, and the difference between the count values in the reference time temp module 1108 and the reference time module 910 is less than a configurable maximum PSN jitter value, or the previous window was found to exceed the jitter budget as well.

The above provides protection from packet delay anomalous spikes induced by lost, and uncorrectable packets into the matrix, while providing quick (millisecond) re-lock to new time-base on multicast stream switches.

The local phase monitor module 912 monitors for sign and magnitude differences between the count value of the local timer module 914 and the reference timer module 910. If the magnitude exceeds the value of the same configurable jitter window mentioned above for the reference time module 910, the reference time from reference time module 910 is immediately loaded into the local time module 910 for quick recovery. Otherwise, the local phase monitor 912 selects either a "Nominal", "Nominal+200 ppm", or "Nominal−200 ppm" 90 KHz increment enable to be stored in the local time module 914 in order to reduce the error to zero (0). The choice of 200 ppm ensures at least 100 ppm headroom above the worst case combination of the local oscillator stabilities of the transmitter 112 and the receiver 108 (e.g.: Tx at +50 ppm, Rx at −50 ppm).

The approach to managing decompression (i.e., decoding) delay and jitter in the receiver 108 is as follows. The timestamp is extracted by the MPEG-TS decapsulation module 408 from the PTS overhead that accompanies the compressed code-stream, and both are presented to the decoder. This timestamp passes through the video decompression module 410 as metadata, and becomes visible to the frame playout delay module 412 when the decompressed video frame data is available. The frame playout delay module 412 compares the timestamp to the receiver 108 local time-base, and initiates the frame transfer to the video pipeline after a configured time difference (i.e. delay) is reached. This configured delay is calculated as the sum of: (1) the average offset between the local time-base and the PTS values as viewed at the input to the video decompression module 410 and (2) the peak magnitude of the video decompression module 410 processing delay, which is a function of its design and encoding parameters.

The average offset between the local time-base and the PTS values as viewed at the input to the video decompression module 410 represent what is expected to be the fixed/unjittered delay of the transmitter 112. Alternatively, this information can be sent by the transmitter 112 to the receiver 108 through some means of messaging.

The above-described process results in a transfer of video frames with minimal frame period jitter toward the video pipeline's frame buffer 418. Any cycle-to-cycle period jitter observed should be dominated by network delay variation, which passes through from the receiver input 402 through to the output of the video decompression module 410. In a closed, properly configured network, dominated by CBR flows, this jitter should be minimal.

Referring to FIGS. 2, 4, 5, and 10A-D, in one embodiment, the steps for transmitting uncompressed video from the transmitter 104, over a network, to the receiver 108 are described as follows.

Video frames (pixels) are received by the transmitter 104 (at video input 202) along with synchronization timing signals from the video source 102 (Step 1002). The video pixel frequency is measured by the measured frequency module 206 (Step 1004). A frame number is assigned to the current video frame by the frame number module 210, and the frame number increments for each received video frame (Step 1006). The video frames are segmented into video packets by the uncompressed video packetization module 204 (Step 1008). For each frame, the associated frame number and measured frequency are inserted into a once-per-frame DM InfoPacket by the DM InfoPacket module 208 (Step 1010). The DM header insertion module 222 prepends a DM header to each packet (video or DM InfoPacket) (Step 1012). The DM header contains the frame and line numbers of the video in the packet.

At the start of a frame, a DM InfoPacket is transmitted over IP. Then, the segmented video frame is transmitted over IP via multiple IP packets. These packets are first wrapped with RTP by the RTP header module 214 (Step 1014) and SMPTE-2022 data by the SMPTE 2022 encapsulation module 216 (Step 1016) before being transmitted. Packets are transmitted out of the transmitter 104 from the network output 218 and received by the receiver 108 at the receiver network input 402 (Step 1018).

In the receiver 108, the SMPTE 2022 decapsulation module 404 uses the SMPTE-2022 data to correct any errors (Step 1020). Next, the video packets are reassembled into video pixels by the uncompressed video extraction module 406 (Step 1022). The information from the DM Header and DM InfoPacket are used as the Tx Start-of-Frame and Frame Number values for that frame. The video pixels (along with the frame number) are sent to scaler 434 for scaling if required (Step 1024). The Tx SOF module 432 extracts from of the video stream at the input of the scaler 434 the start-of-frame signal (Tx_top_of_frame) and frame number (Tx_frame_num) associated with that start-of-frame (Step 1026). The video pixels (along with the frame number) are then written into the frame buffer 418 (Step 1028).

The video pixels (along with the frame number) are read out of the frame buffer 418 based on the signals from the video timing generator 420 (Step 1030). The Rx SOF module 424 extracts from the video stream at the output of the video timing generator 420 the start-of-frame signal (Rx_top_of_frame) and frame number (Rx_frame_num) associated with that start-of-frame (Step 1032).

The PLL 500 in the video clock locking module 428 uses the Tx start-of-frame signal (Tx_top_of_frame), Tx frame number (Tx_frame_num), Rx start-of-frame signal (Rx_top_of_frame), and Rx frame number (Rx_frame_num) to calculate the phase difference (delay) between the Tx Frame being written into the frame buffer and the Rx Frame being read out of the frame buffer (Step 1034). This phase difference is adjusted with an offset parameter, allowing a constant measured delay between the input and output of the frame buffer to be interpreted as having a zero (0) phase difference (Step 1036).

This adjusted phase difference is then clamped, filtered by the low-pass filter 504, and filtered by the PD filter 506 (Step 1038). The filtered adjusted phase difference is then thresholded by the discriminator module 508 (Step 1040) to adjust the output of the clock generator module 510 to produce an adjusted clock that is sent to the clock control module 430 (Step 1042). The clock control module 430 converts/translates the logical clock increment/decrement commands (adjust clock frequency) from the video clock locking module 428 into the actual commands (control signals) needed for the video clock 426 (Step 1044). The video clock 426 produces the Rx video clock (pixel clock), which is used as the source for the video timing generator 420, which reads video pixels from the frame buffer (Step 1046). Finally, video pixels are output from the video output 422 of the receiver 108 to the display 110 with synchronization timing signals (Step 1048).

Referring to FIGS. 3, 4, 5, and 11A-D, in one embodiment, the steps for transmitting compressed video from the transmitter 112, over a network, to the receiver 108 are described as follows.

Video frames (pixels) are received by the transmitter 112 (at video input 302) along with synchronization timing signals from the video source 102 (Step 1102). The video pixel frequency is measured by the measured frequency module 306 (Step 1104). A frame number is assigned to the current video frame by the frame number module 310, and the frame number increments for each received video frame (Step 1106). The video frames are compressed and segmented into compressed video by the video compression module 304 (Step 1108). Next, the MPEG-TS encapsulation module 322 applies PES and TS headers to the compressed video with timing information from the Tx System Timer 320 (Step 1110)

For each frame, the associated frame number and measured frequency are inserted into a once-per-frame DM InfoPacket by the DM InfoPacket module 208 (Step 1112). At the start of a frame, a DM InfoPacket is transmitted over IP. Then, the segmented video frame is transmitted over IP via multiple IP packets. Before any packets are transmitted, the RTP header module 314 prepends an RTP header to each packet (compressed video or DM InfoPacket), which includes the timing information from the Tx System Timer 320 (Step 1114). These packets are then wrapped with SMPTE-2022 data by the SMPTE 2022 encapsulation module 216 (Step 1116). Packets are then transmitted out of the transmitter 112 from the network output 318 and received by the receiver 108 at the receiver network input 402 (Step 1118).

In the receiver 108, the SMPTE 2022 decapsulation module 404 uses the SMPTE-2022 data to correct any errors (Step 1120). The MPEG-TS decapsulation module 408 receives packets that contain MPEG Transport Stream and transmits Elementary Stream (ES) compressed video to the video decompression module 410 (Step 1122). The video decompression module 410 uncompressed the compressed video packets into video pixels (Step 1124). The uncompressed video pixel frame is delayed by the frame playout delay module 412 until the maximum delay through the system has elapsed. Then, the video frame is output (Step 1126). The arrival of the video frame from the Frame Playout Delay module 412 is used as the Tx Start-of-Frame, and the Tx Frame Number value is from the received DM InfoPacket.

The video pixels (along with the frame number) are sent to scaler 434 for scaling if required (Step 1128). The Tx SOF module 432 extracts from of the video stream at the input of the scaler 434 the start-of-frame signal (Tx_top_of_frame) and frame number (Tx_frame_num) associated with that start-of-frame (Step 1130). The video pixels (along with the frame number) are then written into the frame buffer 418 (Step 1132).

The video pixels (along with the frame number) are read out of the frame buffer 418 based on the signals from the video timing generator 420 (Step 1134). The Rx SOF module 424 extracts from the video stream at the output of the video timing generator 420 the start-of-frame signal (Rx_top_of_frame) and frame number (Rx_frame_num) associated with that start-of-frame (Step 1136).

The PLL 500 in the video clock locking module 428 uses the Tx start-of-frame signal (Tx_top_of_frame), Tx frame number (Tx_frame_num), Rx start-of-frame signal (Rx_top_of_frame), and Rx frame number (Rx_frame_num) to calculate the phase difference (delay) between the Tx Frame being written into the frame buffer and the Rx Frame being read out of the frame buffer (Step 1138). This phase difference is adjusted with an offset parameter, allowing a constant measured delay between the input and output of the frame buffer to be interpreted as having a zero (0) phase difference (Step 1140).

This adjusted phase difference is then clamped, filtered by the low-pass filter 504, and filtered by the PD filter 506 (Step 1142). The filtered adjusted phase difference is then thresholded by the discriminator module 508 (Step 1144) to adjust the output of the clock generator module 510 to produce an adjusted clock that is sent to the clock control module 430 (Step 1146). The clock control module 430 converts/translates the logical clock increment/decrement commands (adjust clock frequency) from the video clock locking module 428 into the actual commands (control signals) needed for the video clock 426 (Step 1148). The video clock 426 produces the Rx video clock (pixel clock), which is used as the source for the video timing generator 420, which reads video pixels from the frame buffer (Step 1150). Finally, video pixels are output from the video output 422 of the receiver 108 to the display 110 with synchronization timing signals (Step 1152).

To achieve low end-to-end latency, all of the video processing steps described herein execute concurrently on portions of a frame (sub-frame portions) and each video processing component has to contribute no more than a fraction of a frame delay (sub-frame time interval). In other words, Video compression, packet encapsulation, error correction, network transmission/reception, decompression, scaling, and frame buffering are all occurring continuously on sub-frame portions at sub-frame interval. An entire image is not required to perform any of the processing steps described herein.

Further, it may take several frame periods for the frame buffer to adapt and reduce the buffer delay to a sub-frame delay after a multicast switch. This is because the video clock cannot correct too quickly or the video display will lose lock (synchronization).

In another embodiment, in order to support differing nominal input and output frame rates, it is necessary to make a slight modification to how the phase of a frame is calculated.

First, the ratio of input-to-output frame rates must be reduced to its lowest terms. For example, an input frame rate of 24 fps and an output frame rate of 60 fps will produce a ratio of 2/5 (numerator/denominator). This means that there will be two (2) input frames for every five (5) output frames (referred to as Groups-of-Frames). Note that frame skip/repeat must be turned on in the frame buffer for frame rate conversion.

Next, instead of using the phase of input and output frames, the phase-locked loop will use the phase of Groups-of-Frames on both the input and output sides of the frame buffer. In the equal frame rate case, the count was from 0.0 to 1.0 over a frame. In the case of differing input and output frame rates, the count is from 0.0 to 1.0 over the Group of Frames.

So for this same example of 24 fps in/60 fps out, the input phase would count 0.0 to 0.5 for the 1st input frame and 0.5 to 1.0 for the 2nd input frame. Similarly, the output phase would count from 0.0 to 0.2 for the $1^{st}$ output frame, 0.2 to 0.4 for the $2^{nd}$ output frame, 0.4 to 0.6 for the $3^{rd}$ output frame, 0.6 to 0.8 for the $4^{th}$ output frame and 0.8 to 1.0 for the $5^{th}$ output frame.

This process allows the PLL to synchronize the start of a Group-of-Frames for input and output frames instead of the start of a frame. As before with the equal input and output frame rates, the PLL offset may be used to shift this start-of-Group-of-Frames by a fixed phase amount, except now the offset is measured in Groups-of-Frames instead of frames.

A video wall is a mode of operation for a group of receivers where an input video frame, sent from a single transmitter, is divided spatially over a group of receivers. Each receiver in the video wall is provisioned to sample a different non-overlapping rectangle of the input frame and scale that portion of the input frame to the full output resolution of that receiver. For instance, if a 2×2 video wall is desired, then receiver A converts the top left portion of the input frame to an entire output frame, receiver B converts the top right portion of the input frame, receiver C converts the bottom left portion, and receiver D converts the bottom right portion of the input frame to an entire output frame. If the displays attached to each receiver are tiled in the same two-dimensional pattern as in the provisioning of the receivers, then a large composite image of the input video frame will be rendered across all of the displays.

If the multiple receivers were free running asynchronously in a skip and repeat mode, there would be motion artifacts on the video wall since each display would have a different delay vs the other displays. A benefit of the above-described frame rate conversion is that all receivers, and therefore all displays would be locked to the original source's frame rate and the frame buffer latency delay could be set the same across all receivers. Consequently, all displays would be synchronized. Scene changes and motion would occur simultaneously across the displays.

The disclosure described herein includes a timing control method, along with an associated hardware/firmware implementation. Specifically, the disclosed system and method employs a phase-locked loop in conjunction to with jitter/rate-match buffer at each receiver, and involves synthesizing a clock that tracks the average data rate of the video signal extracted from the received packet stream. This approach permits the source to operate with its own internal timing and places the onus on the receiver to synthesize a clock that matches the average frequency of video frame information that it receives from the transmitter. Additionally, it eliminates the need for a video buffer that operates in skip-and-repeat mode (at least during the steady state). The disclosed method also (i) minimizes the magnitude of the wander that is passed to the connected equipment, (ii) permits a higher bandwidth PLL implementation to reduce stabilization time (i.e. time to minimum static phase error), (iii) provides a means to accurately control A/V lip-sync, and (iv) provides a means to accurately control receiver-to-receiver outputs skew in multi-receiver applications (e.g. a video wall).

ALTERNATE EMBODIMENTS

Variations, modifications, and other implementations of what is described herein may occur to those of ordinary skill in the art without departing from the spirit and scope of the invention. Accordingly, the invention is not to be defined only by the preceding illustrative description.

What is claimed is:

1. A system for distributing video data over a network, the system comprising:
at least one asynchronous video source configured for outputting video data over a first interface, the video data having a first frame rate;
at least one video sink;
at least one video transmitter configured for receiving video data from the at least one video source over the first interface, processing the video data by encoding the video data to include video frame boundary information, packetizing the video data, and transmitting the video data over the network, where the processing occurs on sub-frame portions of the video data in sub-frame time intervals; and
at least one video receiver comprising a video frame buffer, a video timing generator, and a phase-locked loop, the at least one video receiver being configured for receiving the video data over the network and processing the video data by retrieving the video frame boundary information, by decoding the video data into video sub-frames, and by writing the video sub-frames to the video frame buffer, where the processing occurs on sub-frame portions of the video data in sub-frame time intervals, the at least one video receiver being further configured for transmitting output video having a second frame rate to the video sink over a second interface, the video timing generator being configured for generating video output timing signals and using the phase-locked loop to synchronize the generated video output timing signals with the video frame boundary information and thereby synchronizing the first frame rate with the second frame rate.

2. The system of claim 1, wherein the at least one video receiver is further configured for processing the video data by converting the video data from a first pixel matrix size with an associated first pixel clock to a second pixel matrix size with an associated second pixel clock.

3. The system of claim 1, wherein the at least one video transmitter is further configured for processing the video data by encoding forward error correction data into the video data, and the at least one video receiver is further configured for processing the video data by retrieving the forward error correction data and recovering corrupt or lost video data.

4. The system of claim 1, wherein the at least one video transmitter is further configured for processing the video data by compressing the video data and the at least one video receiver is further configured for processing the video data by decompressing the compressed video data.

5. The system of claim 4, wherein the at least one video receiver further comprises a sub-frame playout delay and wherein the at least one video receiver is further configured for processing the video data by using the sub-frame playout delay to convert a variable decompression delay into a constant fixed delay and thereby reduce the variability of the data rate of the decompressed video data.

6. The system of claim 1, wherein the phase-locked loop uses read and write positions of the frame buffer to calculate phase error.

7. The system of claim 6, wherein the read or write positions of the frame buffer are offset to provide a buffer delay prior to calculating the phase error.

8. The system of claim 7, wherein the buffer delay is adjusted to compensate for measured network jitter between the video transmitter and the video receiver.

9. The system of claim 1, wherein the at least one video receiver is further configured for switching from processing video data received from the at least one transmitter to processing video data received from a second transmitter, and wherein the video timing generator generates free running timing signals after the switching and gradually synchronizes with the second transmitter thereby preventing the sink from losing signal lock.

10. The system of claim 1, wherein the at least one video transmitter is further configured for switching from processing video data received from the at least one source to processing video data received from a second source, and wherein the video timing generator generates free running timing signals after the switching and gradually synchronizes with the second source thereby preventing the sink from losing signal lock.

11. The system of claim 1, further comprising a plurality of video receivers and a plurality of video displays, wherein each of the plurality of video receivers transmits a different upsampled portion of the output video to a different one of the plurality of video displays, thereby producing a complete video image across the plurality of video displays.

12. A method for distributing video data over a network, the method comprising:
providing at least one asynchronous video source;
outputting, by the at least one video source, video data over a first interface, the video data having a first frame rate;
providing at least one video sink;
providing at least one video transmitter;
receiving, by the at least on video transmitter, video data from the at least one video source over the first interface;
processing, by the at least one video transmitter, the video data by encoding the video data to include video frame boundary information packetizing the video data, where the processing occurs on sub-frame portions of the video data in sub-frame time intervals;
transmitting, by the at least one video transmitter, the video data over the network;
providing at least one video receiver comprising a video frame buffer, a video timing generator, and a phase-locked loop;
receiving, by the at least one video receiver, the video data over the network;
processing, by the at least one video receiver, the video by retrieving the video frame boundary information, decoding the video data into video sub-frames, and writing the video sub-frames to the video frame buffer, where the processing occurs on sub-frame portions of the video data in sub-frame time intervals,
transmitting, by the at least one video receiver, output video having a second frame rate to the video sink over a second interface,
generating, by the video timing generator, video output timing signals; and
synchronizing, by the video timing generator, the generated video output timing signals with the video frame boundary information by using the phase-locked loop and thereby synchronizing the first frame rate with the second frame rate.

13. The method of claim 12, further comprising processing, by the at least one video receiver, the video data by converting the video data from a first pixel matrix size having a first pixel clock to a second pixel matrix size having a second pixel clock.

14. The method of claim 12, further comprising processing, by the at least one video transmitter, the video data by encoding forward error correction data into the video data; and processing, by the at least one video receiver, the video data by retrieving the forward error correction data and recovering corrupt or lost video data.

15. The method of claim 12, further comprising processing, by the at least one video transmitter, the video data by compressing the video data; and processing, by the at least one video receiver, the video data by decompressing the compressed video data.

16. The method of claim 15, wherein the at least one video receiver further comprises a sub-frame playout delay; and further comprising processing, by the at least one video receiver, the video data by using the sub-frame playout delay to convert a variable decompression delay into a constant fixed delay and thereby reduce the variability of the data rate of the decompressed video data.

17. The method of claim 12, further comprising calculating phase error, by the phase-locked loop, using read and write positions of the frame buffer.

18. The method of claim 17, further comprising offsetting the read or write positions of the frame buffer to provide a buffer delay prior to calculating the phase error.

19. The method of claim 18, further comprising adjusting the buffer delay to compensate for measured network jitter between the at least one video transmitter and the at least one video receiver.

20. The method of claim 12, further comprising switching, by the at least one video receiver, from processing video data received from the at least one transmitter to processing video data received from a second transmitter; and generating, by the video timing generator, free running timing signals after the switching and gradually synchronizing with the second transmitter thereby preventing the sink from losing signal lock.

21. The method of claim 12, further comprising switching, by the at least one video receiver, from processing video data received from the at least one source to processing video data received from a second source; and generating, by the video timing generator, free running timing signals after the switching and gradually synchronizing with the second source thereby preventing the sink from losing signal lock.

22. The method of claim 12, further comprising providing a plurality of video receivers and a plurality of video displays, and transmitting, by each of the plurality of video receivers, a different upsampled portion of the output video to a different one of the plurality of video displays and thereby producing a complete video image across the plurality of video displays.

* * * * *